(12) United States Patent  (10) Patent No.: US 8,330,259 B2
Soler Castany et al.  (45) Date of Patent: Dec. 11, 2012

(54) ANTENNA IN PACKAGE WITH REDUCED ELECTROMAGNETIC INTERACTION WITH ON CHIP ELEMENTS

(75) Inventors: Jordi Soler Castany, Mataro (ES); Carles Puente, Barcelona (ES); Jose Mumbru Forn, Barcelona (ES)

(73) Assignee: Fractus, S.A., Sant Cugat del Valles (ES)

( * ) Notice: Subject to any disclaimer, the term of this patent is extended or adjusted under 35 U.S.C. 154(b) by 1231 days.

(21) Appl. No.: 11/572,380

(22) PCT Filed: Jul. 22, 2005

(86) PCT No.: PCT/EP2005/008032
§ 371 (c)(1),
(2), (4) Date: Jan. 19, 2007

(87) PCT Pub. No.: WO2006/008180
PCT Pub. Date: Jan. 26, 2006

(65) Prior Publication Data
US 2008/0265038 A1  Oct. 30, 2008

Related U.S. Application Data

(60) Provisional application No. 60/590,695, filed on Jul. 23, 2004.

(51) Int. Cl.
*H01L 23/02* (2006.01)
(52) U.S. Cl. .. 257/678; 257/730; 257/777; 257/E23.169
(58) Field of Classification Search .................. 257/678, 257/679, 730, 777, 778, E23.169, E23.175, 257/E23.176
See application file for complete search history.

(56) References Cited

U.S. PATENT DOCUMENTS

| 4,232,277 A | 11/1980 | Dickens et al. |
| 4,751,513 A | 6/1988 | Daryoush et al. |
| 4,843,468 A | 6/1989 | Drewery |
| 5,363,114 A | 11/1994 | Shoemaker |
| 5,386,214 A | 1/1995 | Sugawara |
| 5,569,879 A | 10/1996 | Gloton |
| 5,621,199 A | 4/1997 | Calari et al. |
| 5,621,913 A | 4/1997 | Tuttle et al. |
| 5,710,458 A | 1/1998 | Iwasaki |
| 5,886,669 A | 3/1999 | Kita |

(Continued)

FOREIGN PATENT DOCUMENTS
DE  19500925 A1  7/1996

(Continued)

OTHER PUBLICATIONS

Ma, G. et al, Dual band antenna mounted on chip case, IEEE, Dec. 3, 2001.

(Continued)

*Primary Examiner* — Matthew E Warren
(74) *Attorney, Agent, or Firm* — Kenyon & Kenyon LLP

(57) ABSTRACT

A IC package for a wireless device includes an antenna that is attached to the chip. The electrically conductive elements of the antenna are spaced away from the antenna and particularly the endpoint of the antenna to prevent interference with the antenna. An element on the IC package may be shielded antenna. The antenna may have the shape of a space-filling curve, including a Hilbert, box-counting or grid dimension curve.

50 Claims, 20 Drawing Sheets

U.S. PATENT DOCUMENTS

| | | | |
|---|---|---|---|
| 5,892,661 | A | 4/1999 | Stafford et al. |
| 5,903,239 | A | 5/1999 | Takahashi |
| 6,011,518 | A | 1/2000 | Yamagishi et al. |
| 6,052,093 | A | 4/2000 | Yao et al. |
| 6,087,990 | A | 7/2000 | Thill et al. |
| 6,107,920 | A | 8/2000 | Eberhardt et al. |
| 6,147,655 | A | 11/2000 | Roesner |
| 6,236,366 | B1 | 5/2001 | Yamamoto et al. |
| 6,239,752 | B1 | 5/2001 | Blanchard |
| 6,240,301 | B1 | 5/2001 | Phillips |
| 6,263,193 | B1 | 7/2001 | Iseki et al. |
| 6,268,796 | B1 | 7/2001 | Gnadinger et al. |
| 6,281,848 | B1 | 8/2001 | Nagumo |
| 6,285,342 | B1 | 9/2001 | Brady et al. |
| 6,320,543 | B1 | 11/2001 | Ohata et al. |
| 6,366,260 | B1 | 4/2002 | Carrender |
| 6,373,447 | B1 | 4/2002 | Rostoker et al. |
| 6,388,631 | B1 | 5/2002 | Livingston et al. |
| 6,421,013 | B1 | 7/2002 | Chung |
| 6,424,315 | B1 | 7/2002 | Glenn et al. |
| 6,465,880 | B1 * | 10/2002 | Dobashi et al. ............... 257/679 |
| 6,476,767 | B2 | 11/2002 | Aoyama et al. |
| 6,509,825 | B1 | 1/2003 | Smit et al. |
| 6,512,482 | B1 | 1/2003 | Nelson et al. |
| 6,535,172 | B2 * | 3/2003 | Hirabayashi ............... 343/725 |
| 6,535,175 | B2 | 3/2003 | Brady et al. |
| 6,563,463 | B1 | 5/2003 | Saito |
| 6,583,762 | B2 | 6/2003 | Hamada |
| 6,611,237 | B2 | 8/2003 | Smith |
| 6,646,609 | B2 | 11/2003 | Yuasa et al. |
| 6,657,592 | B2 | 12/2003 | Dening et al. |
| 6,670,921 | B2 | 12/2003 | Sievenpiper et al. |
| 6,674,409 | B2 | 1/2004 | Cheah |
| 6,697,021 | B2 | 2/2004 | Shi |
| 6,710,744 | B2 | 3/2004 | Morris et al. |
| 6,716,103 | B1 | 4/2004 | Eck et al. |
| 6,717,494 | B2 | 4/2004 | Kikuchi et al. |
| 6,744,411 | B1 | 6/2004 | Osterhues et al. |
| 6,745,945 | B1 | 6/2004 | Limelette |
| 6,819,293 | B2 | 11/2004 | De Graauw |
| 6,998,709 | B2 * | 2/2006 | Khorram ............... 257/728 |
| 7,095,372 | B2 * | 8/2006 | Soler Castany et al. ............... 343/700 MS |
| 7,511,675 | B2 | 3/2009 | Puente-Baliarda et al. |
| 7,586,414 | B2 | 9/2009 | Kai et al. |
| 2001/0046126 | A1 | 11/2001 | Colello |
| 2002/0005433 | A1 | 1/2002 | Nochi et al. |
| 2002/0033773 | A1 | 3/2002 | Hirabayashi |
| 2002/0058539 | A1 | 5/2002 | Underbrink et al. |
| 2002/0089456 | A1 | 7/2002 | Hamada |
| 2002/0094661 | A1 | 7/2002 | Enquist |
| 2002/0101382 | A1 | 8/2002 | Konishi |
| 2003/0102544 | A1 * | 6/2003 | Nishikawa ............... 257/678 |
| 2004/0014428 | A1 | 1/2004 | Franca-Neto |
| 2004/0119644 | A1 | 6/2004 | Puente-Baliarda et al. |
| 2004/0129785 | A1 | 7/2004 | Luu |
| 2004/0129786 | A1 | 7/2004 | Reignoux |
| 2004/0137971 | A1 * | 7/2004 | Shoji ............... 455/575.5 |
| 2004/0222930 | A1 | 11/2004 | Sun |
| 2004/0246187 | A1 | 12/2004 | Hara et al. |
| 2005/0238149 | A1 | 10/2005 | De Leon |
| 2006/0076658 | A1 | 4/2006 | Wu |
| 2006/0141958 | A1 | 6/2006 | Brosnan |
| 2006/0170610 | A1 | 8/2006 | Rabinovich et al. |

FOREIGN PATENT DOCUMENTS

| | | | |
|---|---|---|---|
| EP | 0523564 | A1 | 1/1993 |
| EP | 0902472 | A2 | 3/1999 |
| EP | 0969375 | | 1/2000 |
| EP | 0978729 | A2 | 2/2000 |
| EP | 1085597 | A2 | 3/2001 |
| EP | 1126522 | A1 | 8/2001 |
| EP | 1130677 | A2 | 9/2001 |
| EP | 1198027 | A1 | 4/2002 |
| EP | 1227540 | A1 | 7/2002 |
| EP | 13070178 | A2 | 5/2003 |
| EP | 1326302 | A3 | 11/2003 |
| EP | 1403960 | A1 | 3/2004 |
| EP | 00909089.5 | B1 | 8/2005 |
| ES | 2112163 | | 3/1998 |
| FR | 2848025 | A1 | 6/2004 |
| JP | 62-262502 | | 11/1987 |
| JP | 01311605 | | 12/1989 |
| JP | 8-52968 | | 2/1996 |
| JP | 0983240 | | 3/1997 |
| JP | 2001292026 | | 10/2001 |
| JP | 2002-158529 | | 5/2002 |
| JP | 2002141726 | | 5/2002 |
| JP | 2002-299933 | | 10/2002 |
| JP | 2004104344 | | 4/2004 |
| WO | 9706578 | | 2/1997 |
| WO | 9927608 | | 6/1999 |
| WO | 9935691 | A1 | 7/1999 |
| WO | 0025266 | A1 | 5/2000 |
| WO | 0034916 | A1 | 6/2000 |
| WO | 0154225 | A1 | 7/2000 |
| WO | 0077728 | A1 | 12/2000 |
| WO | 01/05048 | A1 | 1/2001 |
| WO | 0104957 | A1 | 1/2001 |
| WO | 0108093 | A1 | 2/2001 |
| WO | 01/22528 | A1 | 3/2001 |
| WO | 01/54225 | A1 | 7/2001 |
| WO | 0154221 | | 7/2001 |
| WO | 0201495 | A1 | 1/2002 |
| WO | 02/29929 | A2 | 4/2002 |
| WO | 02060004 | A2 | 8/2002 |
| WO | 02/095869 | A1 | 11/2002 |
| WO | 02/096166 | A1 | 11/2002 |
| WO | 03/050913 | A1 | 6/2003 |
| WO | 03/096475 | A1 | 11/2003 |
| WO | 2004/025778 | A1 | 3/2004 |
| WO | 2004019261 | A2 | 3/2004 |
| WO | 2004021271 | A1 | 3/2004 |
| WO | 2004/042868 | A1 | 5/2004 |
| WO | 2005/109330 | A1 | 11/2005 |
| WO | 2006120250 | A2 | 11/2006 |
| WO | 2007028448 | A1 | 3/2007 |

OTHER PUBLICATIONS

Breur, J.J. et al, Bluetooth radio module with embedded antenna diversity, Proceedings of European Conference on Wireless Technology, München, Germany, Oct. 2003.

Ito, et al., "A 60-GHz-band planar dielectric waveguide filter for flip-chip modules," IEEE Transactions on Microwave Theory and Techniques 49(12): 2431-2436, Dec. 2001.

Chakraborty, S. et al, A 2.4-GHz radio front in RF system-on-package technology, IEEE Microwave Magazine, Jun. 2002.

RF / Wireless design services, Amkor Technology, Jun. 2003.

Scanlan, C. M. et al, System-in-package technology, application and trends, Amkor Technology, Jun. 2005.

Halbo, Ohlckers, Electronic components, packaging and production, ISBN: 82-992193-2-9, 1993.

Sherwani, Yu, Badida, Introduction to multi chip modules, John Wiley & Sons, 1995.

Caswell, Yorke, Invisible errors in dimension calculations: geometric and systematic effects, Dimensions and entropies in chaotic systems, G. Mayer-Kress edit., Springer-Verlag, Berlin 1989, second ed., pp. 123-136.

Mathews, Gaynor, RF System in Package: Considerations, Technologies and Solutions, Whitepaper from Amkor Technology (http://www.amkor.com/products/notes_papers/RF_SiP_Paper041403.pdf), Apr. 14, 2003.

RF/Wireless Design Services Sheet, Amkor Technology (http://www.amkor.com/services/test/RF_Wireless_Test_Design.pdf), visited on Jan. 22, 2007.

Lim et al, RF-System-on-package (SOP) for wireless communications, IEEE microwave magazine, Mar. 2002.

Griffin, et al, Electromagnetic design aspects of packages for monolithic microwave integrated circuit-based arrays with integrated antenna elements, IEEE Transactions on antennas and propagation, vol. 43, No. 9, Sep.1995.

Zhao et al, Design of "Chip-Scale" patch antennas for 5-6GHz wireless microsystems, IEEE Antennas and propagation international symposium, Jul. 2001.
Hansen, Fundamental limitations in antennas, Proceedings of the IRE, Feb. 1981.
Wheeler, Fundamental limitations of small antennas, Proceedings of the IRE, Dec. 1947.
Judd et al, Estimating dimensions with confidence, International journal of bifurcation and chaos, vol. 1, No. 2, 1991, pp. 467-470.
Singh et al, Small H-shaped antennas for MMIC applications, IEEE Transactions on antennas and propagation, Jul. 2000.
Papapolymerou et al, Micromachined patch antennas, IEEE Transactions on antennas and propagation, Feb. 1998.
Hall, System applications: the challenge for active integrated antennas, AP 2000 Millenium conference on antennas and propagation, Apr. 2000.
Flaherty, National combines analogue and digital expertise for 3G, Wireless week, May 2002.
Matsushima et al, Electromagnetically coupled dielectric chip antenna, IEEE Transactions on antennas and propagation, Jun. 1998.
Harris, Handset industry debates Bluetooth options, Wireless europe, May 2002.
Bluetooth radio, www.palowireless.com/database/ericsson/pba3130lr1e.pdf, Aug. 2001.
Zhang et al, Integration of a planar inverted F antenna on a cavity-down ceramic ball grid array package, IEEE Transactions on antennas and propagation, Jun. 2002.
Tanidokoro et al, I-wavelength loop type dielectric chip antennas, IEEE Transactions on antennas and propagation, Jan. 1998.
Liu et al, Dual-frequency planar inverted-F antenna, IEEE Transactions on antennas and propagation, Oct. 1997.
Chu, Physical limitations of omni-directional antennas, Journal of applied physics, Dec. 1948.
Kim et al, Integrated dipole antennas on silicon substrates for intra-chip communication, IEEE Transactions on antennas and propagation, Jan. 1999.
Reza et al, Radios for next-generation wireless networks, IEE Microwave magazine, Mar. 2005.
G. Poilanse et al., Achieving antenna isolation within wireless systems, Microwaves & RF webcastseries / Penton, 2003.
Desclos, V-band double-slot antenna integration on LTCC substrate using thick-film technology, Microwave and Optical Technology Letters, Mar. 2001, vol. 28, No. 5, pp. 354-357.
TSAI, Miniature antenna integration in chip-scale packaging, Tessera—2003 GHz Interconnect Workshop, 2003.
Bedri et al. A packaged miniature antenna for wireless networking, International Symposium on Microelectronic International Microelectronics and Packaging Society (IMAPS 2001), 2001.
Long, "Ethertronics, Magnolia Tout Global CDMA Handset Offering". The Electronics Industry Knowledge Network, 2002.
Nagumo, et al., Dual Resonance Chip Dielectric Antenna With a Slant Gap For Hand Wireless Communication Tools, by Murata Mfg. Co., Ltd, Japan.
Song, P. Novel antenna design for future mobile systems, University of Birmingham, May 2001.
Bhavsar, Samir A.: Letter: Fractus v. Samsung et al., Case No. 6:09-cv-00203-LED: Disclosure of Material Information to the USPTO; Oct. 28, 2009.
Wille, David G.: HTC's First Amended Answer and Counterclaim; Oct. 2, 2009.
Wimer, Michael C.; USPTO Office Actions for U.S. Appl. No. 10/422,578; Oct. 4, 2004, Apr. 7, 2005, Aug. 24, 2005, Jan. 26, 2006, Mar. 12, 2007, Aug. 23, 2007 and Mar. 26, 2008.
D.A. Russell, J.D. Hanson, E. Ott, "Dimension and Strange Attractors", Phys. Rev. Lett. 45 (1980) 1175-1178.
Paul So., Ernest Barreto, and Brian R. Hunt, "Box-counting dimension without boxes: Computing D0 from average expansion rates", Physical Review E (Statistical Physics, Plasmas, Fluids, and Related Interdisciplinary Topics)—Jul. 1999—vol. 60, Issue 1, pp. 378-385.
http://www.redbrick.dcu.ie/~bolsh/thesis/node16.html.
http://www.redbrick.dcu.ie/~bolsh/thesis/node22.html.
http://www.sewanee.edu/physics/PHYSICS123/BOX%20COUNTING%20DIMENSION.html.
Heinz-Otto Peitgen, et al, "Chaos and Fractals—New Frontiers of Science" (1992), pp. 212-216, 387-388.
Paul S. Addison, "Fractals and Chaos—An illustrated Course" (Institute of Physics Publishing, Bristol and Philadelphia; IOP Publishing 1997), pp. 30, 31 &33.
Kenneth Falconer, "Fractal Geometry—Mathematical Foundations and Applications" (2nd edition) (John Wiley & Sons. Ltd., 2003) (the first edition is from 1990).
Yuan Y. Tang. et al., "The application of Fractal Analysis to Feature Extraction" (1999 IEEE). pp. 875-879.
Vincent Ng. et al., "Diagnosis of Melanoma with Fractal Dimensions" (IEEE TENCON'93 / Beijing), pp. 514-517.
S. Kobayashi et al., "Estimation of 3d Fractal Dimension of Real Electrical Tree Patterns" (IEEE 1994; Proceedings of the 4th International Conference on Properties and Applications of Dielectric Materials, Jul. 3-8, 1994 Brisbane, Australia), pp. 359-362.
Jie Feng et al., "Fractional Box-Counting Approach to Fractal Dimension Estimation", (IEEE 1996; Proceedings of ICPR'96), pp. 854-858.
S. Rouvier, et al., "Fractal Analysis of Bidimensional Profiles and Application to Electromagnetic Scattering from Soils" (1996 IEEE), pp. 2167-2169.
Nirupam Sarkar, et al., "An Efficient Differential Box-Counting Approach to Compute Fractal Dimension of Image" (IEEE Transactions on Systems, Man, and Cybernetics, vol. 24, No. 1, Jan. 1994), pp. 115-120.
Susan S. Chen, et al., "On the Calculation of Fractal Features from Images" (IEEE Transactions on Pattern Analysis and Machine Intelligence, vol. 15, No. 10, Oct. 1993), pp. 1087-1090.
Alan I. Penn, et al., "Fractal Dimension of Low-Resolution Medical Images" (18th Annual International Conference of the IEEE Engineering in Medicine and Biology Society, Amsterdam 1996; 4.5.3: Image Pattern Analysis I), pp. 1163-1165.
Fabrizio Berizzi, et al., "Fractal Analysis of the Signal Scattered from the Sea Surface" (IEEE Transactions on Antennas and Propagation, vol. 47, No. 2, Feb. 1999), pp. 324-338.
Hendrik F. V Boshoff, "A Fast Box Counting Algorithm for Determining the Fractal Dimension of Sampled Continuous Functions" (1992 IEEE), pp. 43-48.
Aug. 14, 2003 Reply to Examination Report for EP1258054 (00909089.5).
Oct. 28, 2004 Summons for EP1258054 (00909089.5).
Dec. 15, 2004 Letter Dealing with Oral Proceedings for EP1258054 (00909089.5).
Jan. 2005 Minutes from Oral Proceedings for EP1258054 (00909089.5).
International Preliminary Examination Report and International Search Report of Aug. 29, 2002 for PCT/EP00/00411 published as WO 01/54225 A1.
EPO Office Action for EP1258054 (00909089.5) dated Feb. 7, 2003.
Hansen, R. C.: "Fundamental Limitations in Antennas"; Proceedings of the IEEE, IEEE. New York, US; Feb. 1981; ISSN 0018-9219, vol. 2, NR. 69, pp. 170-182.
Ramesh Garg et al., "Microstrip Antenna Design Handbook" (2001, Artech House, Inc.), selected pages.
Richard C. Johnson (Editor), "Antenna Engineering Handbook" (McGraw Hill Inc.), Chapter "Microstrip Antennas" by Robert E. Munson, selected pages.
Constantine A. Balanis, "Antenna Theory" (1982, John Wiley & Sons, Inc.),selected pages.
Keith R. Carver et al., "Microstrip Antenna Technology" (IEEE Transactions on Antennas and Propagation, vol. AP-29, No. 1, Jan. 1981), pp. 2-23.
David M. Pozar et al., "Microstrip Antennas—The Analysis and Design of Microstrip Antennas and Arrays" (1995, Institute of Electrical and Electronic Engineers, Inc.), p. ix and 3.
John D. Kraus, "Antennas" (1988, McGraw-Hill, Inc.), preface and list of contents.
Kim, K., A Plane Wave Model Approach to Understanding Propagation in an Intra-Chip Communication System, by Dept. of Electrical and Computer Engineering, University of Florida, (2001).

Zhang et al., Integration of a Planar Inverted F Antenna On A Cavity-Down Ceramic Ball Grid Array Package, by Integrated Systems Research Lab, School of EEE, Nanyang Technological University, Singapore,(2002).

Mailloux, R.J. Antenna array architecture. Proceedings of the IEEE, 1992.

Jaggard, D. L. Rebuttal expert report of Dr. Dwight L. Jaggard (redacted version). Fractus. Feb. 16, 2011.

Jaggard, D. L. Expert report of Dwight L. Jaggard (redacted)—expert witness retained by Fractus. Fractus. Feb. 23, 2011.

* cited by examiner

ANTENNA IN PACKAGE WITH REDUCED ELECTROMAGNETIC INTERACTION WITH ON CHIP ELEMENTS

CROSS-REFERENCE TO RELATED APPLICATIONS

This is a 371 national phase application of PCT/EP2005/008032, filed Jul. 22, 2005. This application also claims priority U.S. Provisional Application Ser. No. 60/590,695, filed Jul. 23, 2004.

FIELD

The technology described in this document relates generally to novel integrated circuit packages. More particularly, this document describes a novel integrated circuit package that include a new family of miniature antennas.

BACKGROUND

There is a trend in the semiconductor industry towards the so-called System on Chip (SoC) and System on Package (SoP) concepts. The full integration of systems or subsystems into a single integrated circuit package, such as Full Wire System in Package (FWSIP), provides many advantages in terms of cost, size, weight, consumption, performance, modularity, and product design complexity. Many electronic devices for consumer applications, such as handsets, wireless devices, (e.g., headsets, dongles, computer interfaces, mouses, keyboards, and remote controls), personal digital assistants (PDAs), or personal computers (PCs) are increasingly including SoP or SoC components. The introduction of wireless capabilities in many other devices such as digital cameras, MP3 players, portable DVD or CD players, smoke detectors, switches, sensors (such as motion, pressure, and temperature sensors), alarms, and medical sensors and meters will benefit from compact, integrated SoP or SoC devices.

In many cases, the ultimate component for achieving the true integration of a FWSiP/FWSoP component is the antenna. The concept of integrating a miniature antenna into a package or module is especially attractive due to the tremendous growth and success of cellular and wireless systems. In particular, there is a new generation of short/medium range wireless connectivity applications such as Bluetooth™, Hyperlan, IEEE802.11 (WiFi), ultra wide band (UWB), Wimax, and Zig Bee systems where the progressive system integration into a single, compact product is becoming a key factor for success.

This concept of integrating a miniature antenna into a package or module is especially attractive in several communication standards and services such as GSM, UMTS, PCS1900, KPCS, CDMA, WCDMA, DAB, and GPS.

Present chip and package designs are typically not designed to incorporate an antenna. Thus, the incorporation of an antenna into a typical integrated circuit package (IC package) design would result in electromagnetic interaction and coupling between the antenna and different parts of the chip, die, module, or package. This would lead to a reduced performance of the antenna in efficiency and bandwidth, among other things, and could also lead to a detuning of the antenna and possible malfunction of the chip. Some typical elements of an IC package which may interfere with the antenna are pads, pins, tracks and ground planes. The present application contains a series of related IC package and printed circuit board (PCB) arrangements that prevent the loss of performance of the antenna in a chip.

IC package dimensions are continuously decreasing and therefore the use of miniature antennas is advantageous. Antennas that include a portion shaped as a space-filling, grid-dimension, or box-counting curve provide very good performance while allowing a high degree of miniaturization. These types of antennas are preferably incorporated in the IC packages.

DETAILED DESCRIPTION

Figure 1:
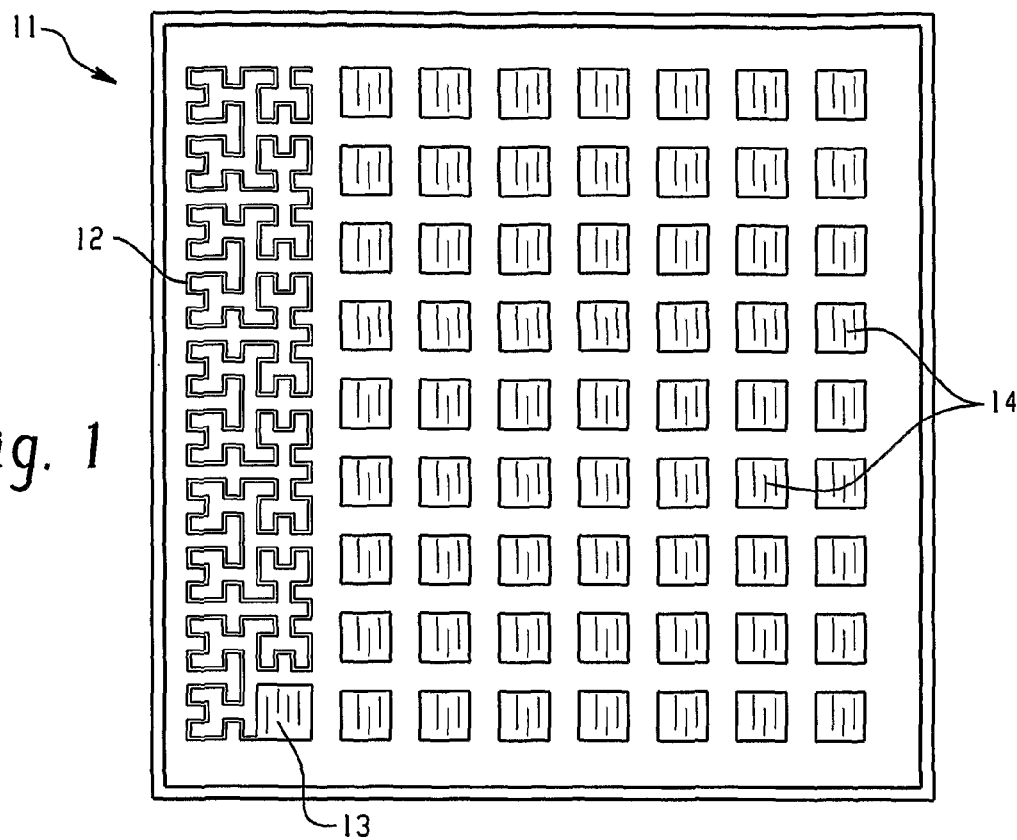
FIG. 1 is a schematic view of an example IC package including an antenna on one side and pads that are outside of the antenna projection.

FIG. 1 is a schematic view of an antenna 12 in an example integrated circuit (IC) package 11. The IC package 11 includes, among other parts, an antenna 12 including a feeding point 13 and pads or pins 14. No pads or pins 14 which may conduct a signal or be connected to a power or ground plane are located in the antenna 12 projection. Antenna projection means the lower or upper projection of the antenna, the lower projection being what is normally understood by the expression underneath the antenna. This location of the pads or pins outside the upper or lower projection (footprint) of the antenna reduces the interaction between the pads and the antenna, preventing a decrease in performance of the antenna. The antenna is preferably in the form of a space-filling curve, but other kinds of antennas may also be used.

It should be understood that the antenna 12 may be included on the same layer or different layers of the IC package as the pads, pins or other components.

In another example, some signal pads could be present in the antenna projection, preferably close to the feeding point 13.

The antenna feed point 13 could be accessible through at least a pad or pin of the IC package 11, and may also be present in the antenna projection without a significant loss in the antenna 12 performance.

Fixation pads could be present in the example IC package 11 in order to attach the IC package 11 to the PCB. When the only function accomplished by these pads is mechanical and no signal or power supply is transmitted by them and no ground is connected to the pins or pads, their effect on the antenna performance is negligible and therefore they may be present in the antenna projection. This arrangement is advantageous in some cases due to the overall reduction on the package or chip size.

Figure 2:
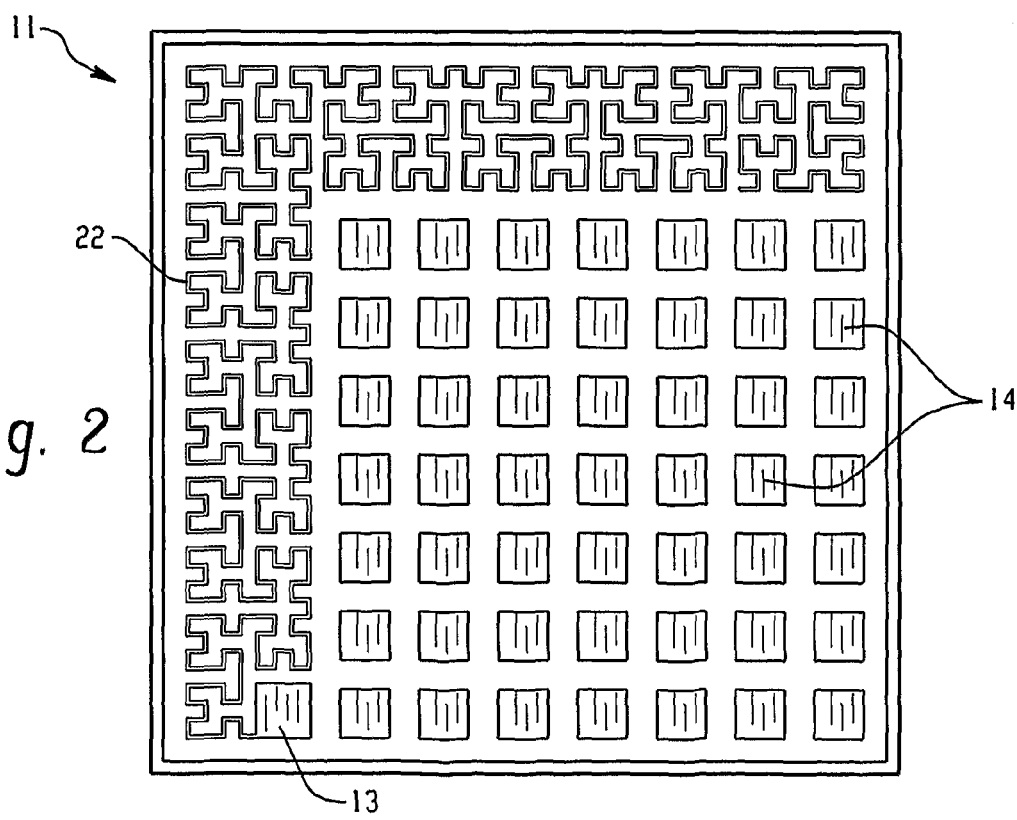
FIG. 2 is a schematic view of an example IC package including an antenna on two sides and pads that are outside the projection of the antenna.

One example of an advantageous arrangement of an antenna 22 with respect to the pads 14 on a IC package 11 is shown in FIG. 2. The antenna 22 in this example is in the shape of an L-shaped Hilbert space-filling curve. It is located on at least a part of the perimeter of the IC package 11 and the pads 14 are located outside the antenna projection. In other examples, other kinds of antennas may also be used.

As in the previous example, fixation pads 14 could be present in the projection of the antenna. If it is necessary to include electrically conducting pads or other conducting components in the antenna projection, then these should be located as close to the antenna feedpoint 13 as possible. This will minimize the interference with the antenna.

The functionality or I/O assignment of the pads or pins 14 might be of importance when considering the interaction of the pads or pins 14 with either of the antennas discussed above 12, 22. Among the different pad or pin functionalities are powering and grounding, radio frequency functionalities, analog signals, digital buses, and other digital signals, such as signals used for the configuration of the IC. As mentioned above, in the case of pins or pads 14 located in the antenna projection, the influence of the pins or pads is smaller when close to the antenna feedpoint 13. The pins or pads 14 should thus be located as far away as possible from the end of the antennas 12, 22, because the antennas 12, 22 are most sensitive at the end.

Figure 3:
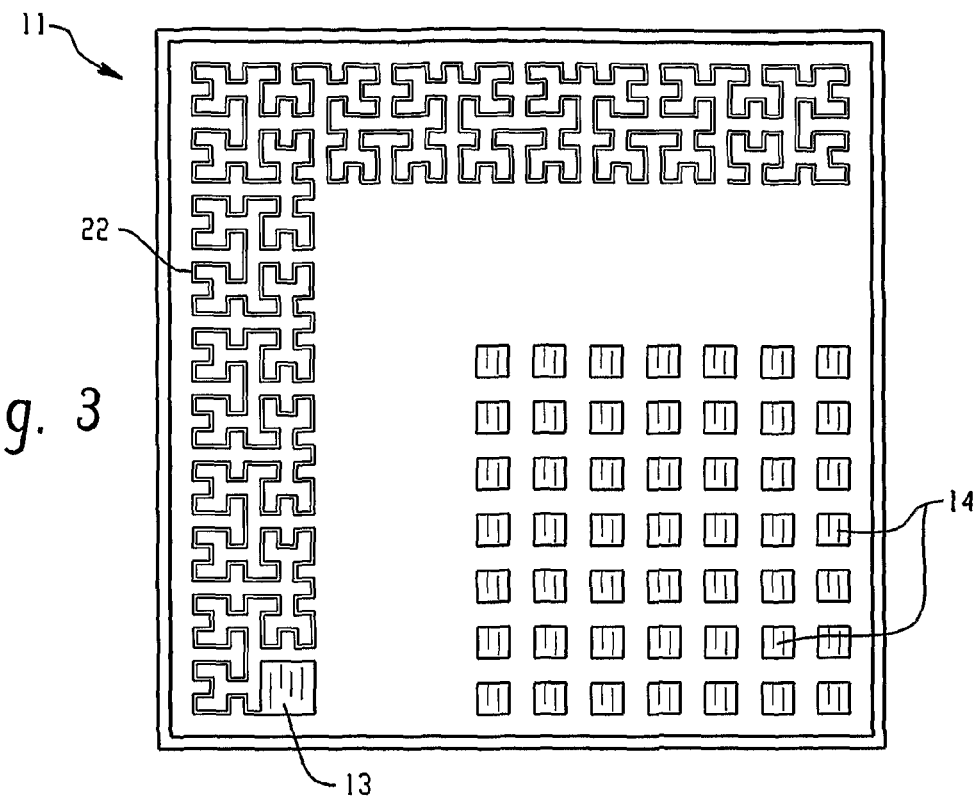
FIG. 3 is a schematic view of an example IC package including an antenna that is located on two sides of the chip, and pins or pads cover a certain percentage of the chip.

FIG. 3 shows an example IC package 11 where pins or pads 14 for grounding, powering, and transmitting signals are located at a distance from the antenna projection, and represent around forty percent of the overall surface of the IC package. This percentage could be increased or decreased depending on the particular design constraints.

If it is necessary to have ground pins in the projection of either of the antennas 12, 22, it is advantageous to have the ground pins or pads at a distance from the feeding point 13 that is not larger than one-fifth of the side of the IC package or one-sixtieth of the wavelength in the free space at the operating frequency of the antennas 12, 22. Similarly, should it be necessary to have the digital data pins in the projection of the antennas 12, 22, it is advantageous to have them at a distance from the feeding point 13 that is not greater than half of the side of the IC package 11 for a package having a side that is one-twelfth of the free-space wavelength of the antenna operating frequency. This would allow the detuning of the antennas 12, 22 to be kept within a ten percent range.

In other examples the ground pins or pads are located at a distance from the feeding point 13 that is not larger than one-half of the side of the IC package or one-twenty-fourth of the wavelength in the free space at the operating frequency of the antennas.

Signal pads and tracks have a loading effect on the antennas 12, 22 which leads to a change in the antenna input impedance and resonance frequency. This effect is more severe when pads and tracks are close to the end of the antennas 12, 22.

Figure 4:
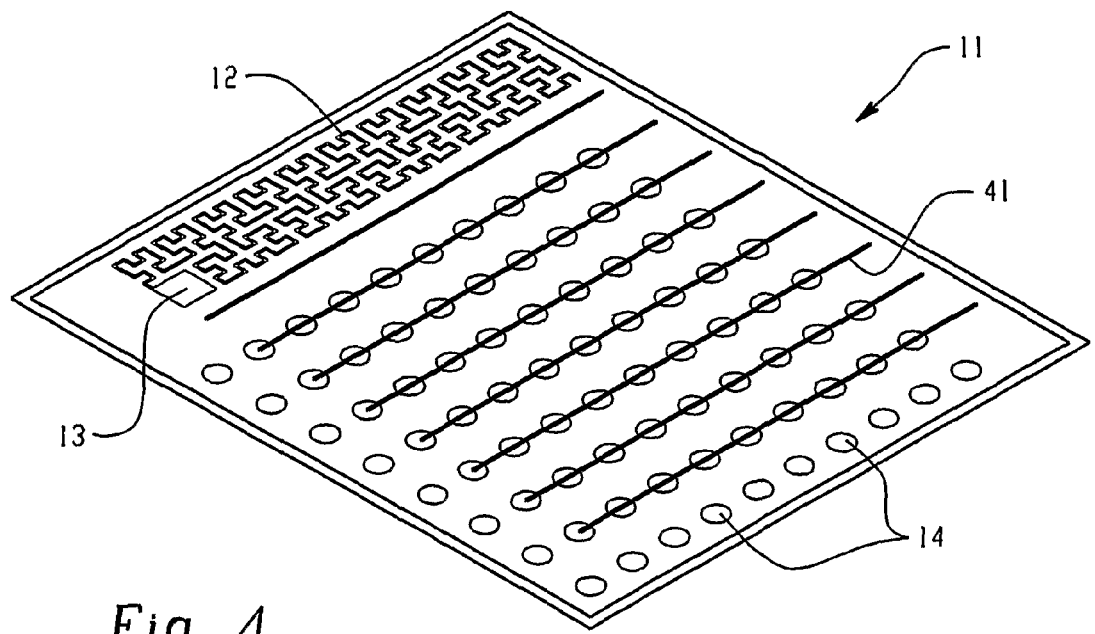
FIG. 4 is a perspective view of an example IC package illustrating conducting traces that are outside of the antenna projection.

FIG. 4 shows an example IC package 11 where no tracks cross the projection of the antenna 12. In one example, the tracks 41 are at least 1 mm away from the projection of the antenna 12 in a ten-by-ten mm IC package for a Bluetooth Radio IC that operates at 2.4 GHz. Should it be necessary to cross the projection of the antenna 12, this crossing should preferably be no further than five mm away from the antenna feedpoint 13 in a 10-by-10 mm package for a Bluetooth Radio IC package. The position of the feedpoint 13 could be in or out of the projection of the antenna 12. Due to the scaling properties of Maxwell's equations, the same features are to be scaled proportionally in packages for other applications working at other wavelengths. For example, in the case of an application running at 1.2 GHz (twice the wavelength for Bluetooth) such signal tracks would preferably cross the antenna footprint at a distance no larger than 10 mm instead of 5 mm.

The placement of the tracks 14 and the routing of the signals may also affect antenna 12 performance. Digital lines filtering could be effective to minimize radio frequency noise. In some examples, this filtering is implemented by any conventional means, for example radio frequency chokes. Another option to prevent coupling is to include digital tracks that are mismatched at RF frequencies. Because tracks cannot propagate the radio frequency signals, less power is coupled (hence more isolation is obtained) and less power is delivered to the output ports on the board.

In general, the use of differential lines is very effective in suppressing noise and interference when the signal is carried by two lines that have the same potential but that have opposite polarity or phase, and the lines are not referred to a common ground from which interfering signals may be coupled.

In other examples, ground planes may be included inside the IC package 11. As a general rule, the greater the distance between the antenna 12 and ground plane, the smaller the interaction (in particular the reduction of the antenna input impedance referred to 50 ohms), and therefore the better the antenna performance.

FIGS. 5 to 8 illustrate several configurations chosen to minimize coupling between the antenna 12 and the internal ground plane.

Figure 5:
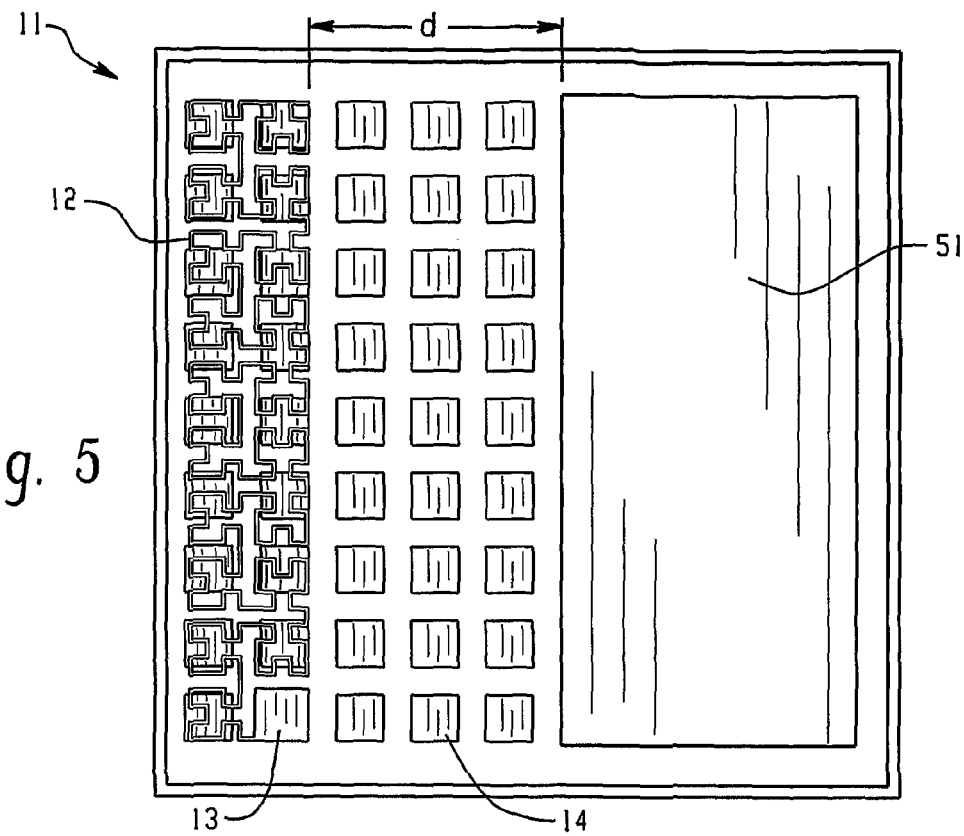
FIG. 5 is a schematic view of an example IC package where the ground plane is located at a distance from the antenna.

In FIG. 5 the antenna 12 is placed parallel to the ground plane 51. The purpose of this arrangement is to maximize the distance between the antenna 12 and ground plane 51. For example, in a 10-by-10 mm package with a free-space wavelength that corresponds to the antenna operating frequency of 120 mm, the distance (d) between the antenna 12 and the ground plane 51 should preferably be 2.5 mm. Unless required by design and performance constraints, an arrangement where no ground plane 51 is close to the end of the antenna is preferable. FIG. 5 illustrates this possibility as an example in a ten-by-ten mm package 11. Due to the scaling properties of Maxwell's equations, the same features are to be scaled proportionally in packages for other applications working at other wavelengths.

In other examples the ground plane is spaced away from the antenna by at least the greater of one-quarter of a side length of the integrated circuit package and one-fiftieth of a free-space operating wavelength of the antenna.

Figure 6:
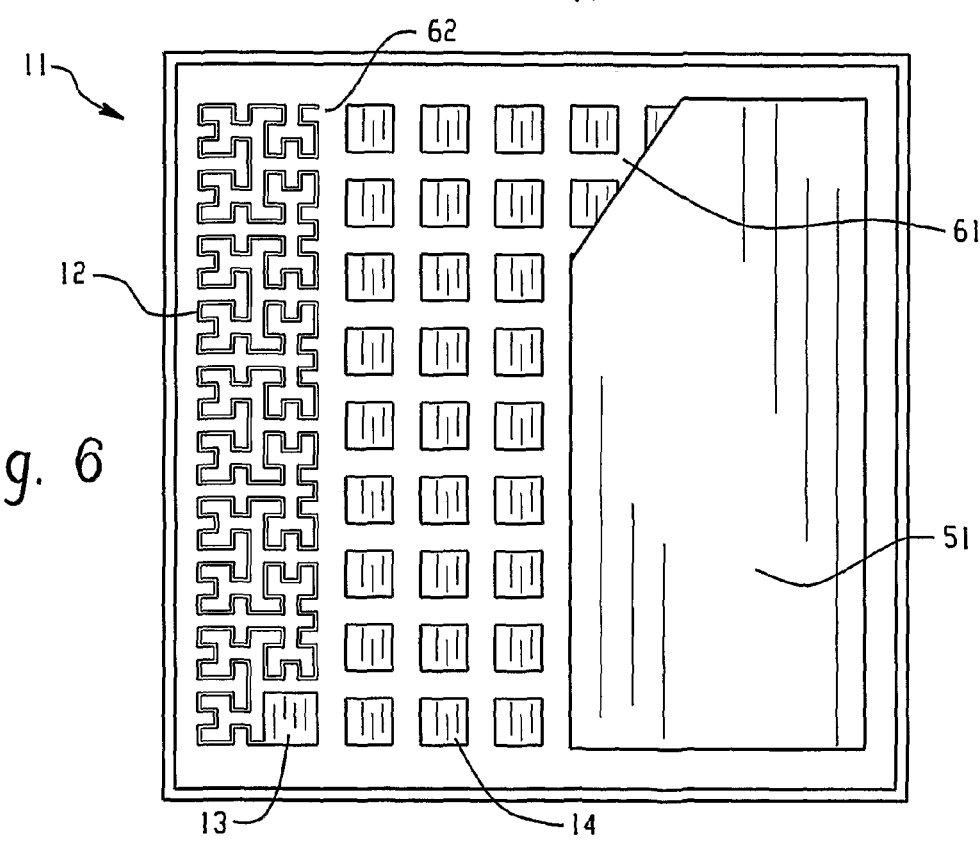
FIG. 6 is a schematic view of an example IC package that includes a ground plane with a cut out.

FIG. 6 shows an example IC package 11 including a large internal ground plane 51. A part of the ground plane 61 is removed to maximize the distance between the end of the antenna 62 and the ground plane 51. In the example of FIG. 6, the upper left part of the ground plane has a cut-off. Other geometries for the inset or cut-off in the ground plane 61 are also possible.

Figure 7:
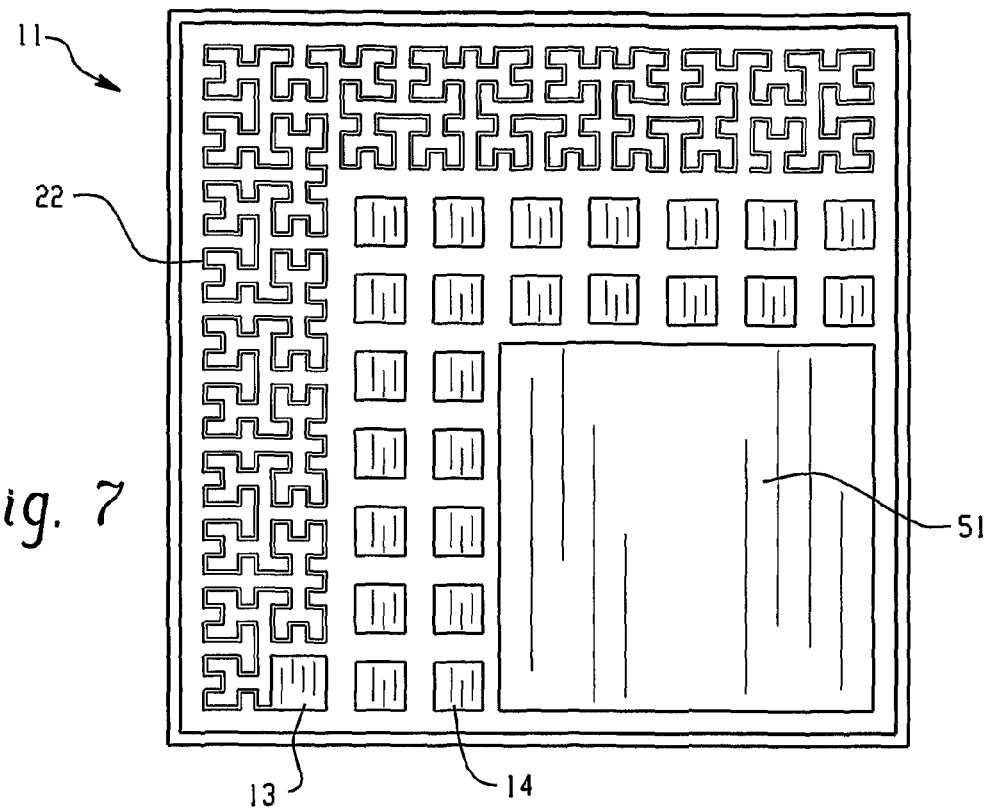
FIG. 7 is a schematic view of an example IC package including an L-shaped antenna and a ground plane.

Depending on the shape of the antenna 22, an example arrangement as shown in FIG. 7 may be preferred. In general, there should be a substantially constant distance from the ground plane 51 to the antenna 22 area, or preferably the distance of the ground plane 51 from the vicinity of the end of the antenna track 62 should be increased. Also, in some examples, the distance between the antenna 22 and the ground plane 51 is reduced in the vicinity of the antenna feeding point.

In some examples, several different ground planes 51, 81 of different types are present on the IC package. These several ground planes 51, 81 are typically chosen from the following group: radio frequency, analog, or digital. Different ground planes are included for the purpose of reducing noise.

Figure 8:
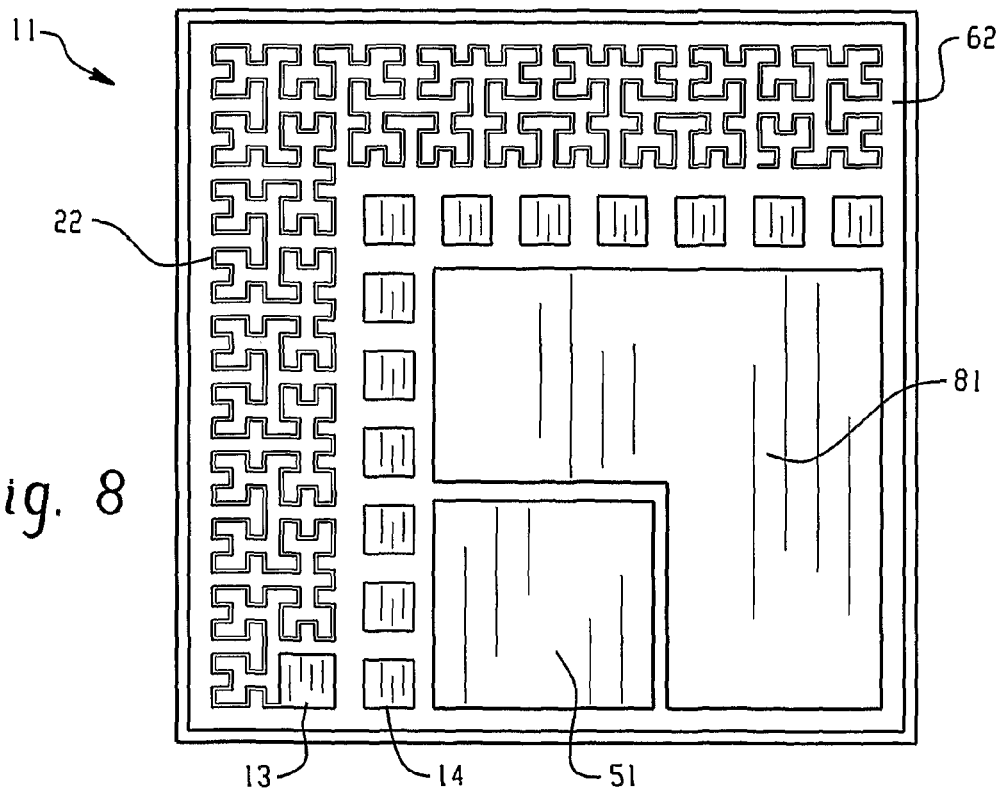
FIG. 8 is a schematic view of an example IC package that includes two different ground planes.

In the example of FIG. 8, two different ground planes 51, 81 are present on the IC package 11. One of them is a radio frequency ground plane 51, and the other is a digital ground plane 81. The radio frequency circuit in this example is connected to the antenna feeding point 13; therefore, it is preferable to minimize the track distance between the feeding point 13 and the RF circuit, for example, by locating the RF ground plane 51 in the position shown in FIG. 8. In this location, the RF ground plane 51, which is the ground plane that the antenna 22 is referred to, is far from the end of the antenna 62.

To avoid having different potential references, the ground planes 51, 81 may be connected by means of an inductor to filter high frequency currents and balance potentials by means of DC currents. This arrangement may be used to connect planes which are outside the IC package 11 with planes that are inside the IC package 11.

In other examples, different types of ground planes may be included that are arranged at different levels.

In other examples, exterior ground planes may be present. For example, the IC package 11 may be mounted on a PCB, particularly a multilayer PCB. One of the layers of a multi-level PCB is normally a ground plane. If this ground plane is within the projection of the antenna its performance could be decreased. One possible solution is to use a PCB where a considerable part of the PCB does not include a ground plane. Hereinafter this part of the PCB that does not include a ground plane is also referred to as 'clearance'. FIGS. 9 to 17 illustrate examples where a part of the PCB does not contain a ground plane. Excluding a ground plane on a part of the PCB diminishes the number of components which might be placed on the PCB, and restricts the possibilities for arranging these components on the PCB. It is therefore advantageous to minimize the amount of PCB without a ground plane. FIGS. 9 to 17 illustrate arrangements where the ground plane clearance is minimized. The coupling between the exterior ground plane and the antenna depends, among other factors, on the shape of the antenna.

Figure 10:
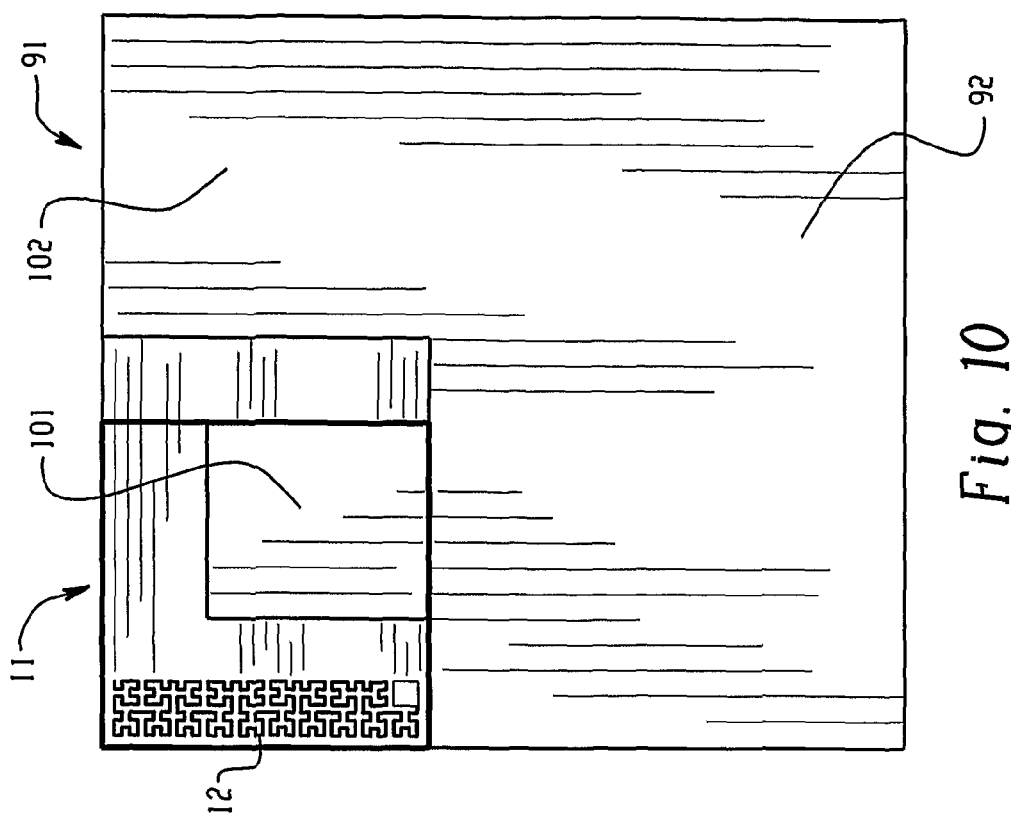
FIG. 10 is a schematic view of an example IC package on a PCB including a ground plane, part of which is located in the projection of the chip.
Figure 9:
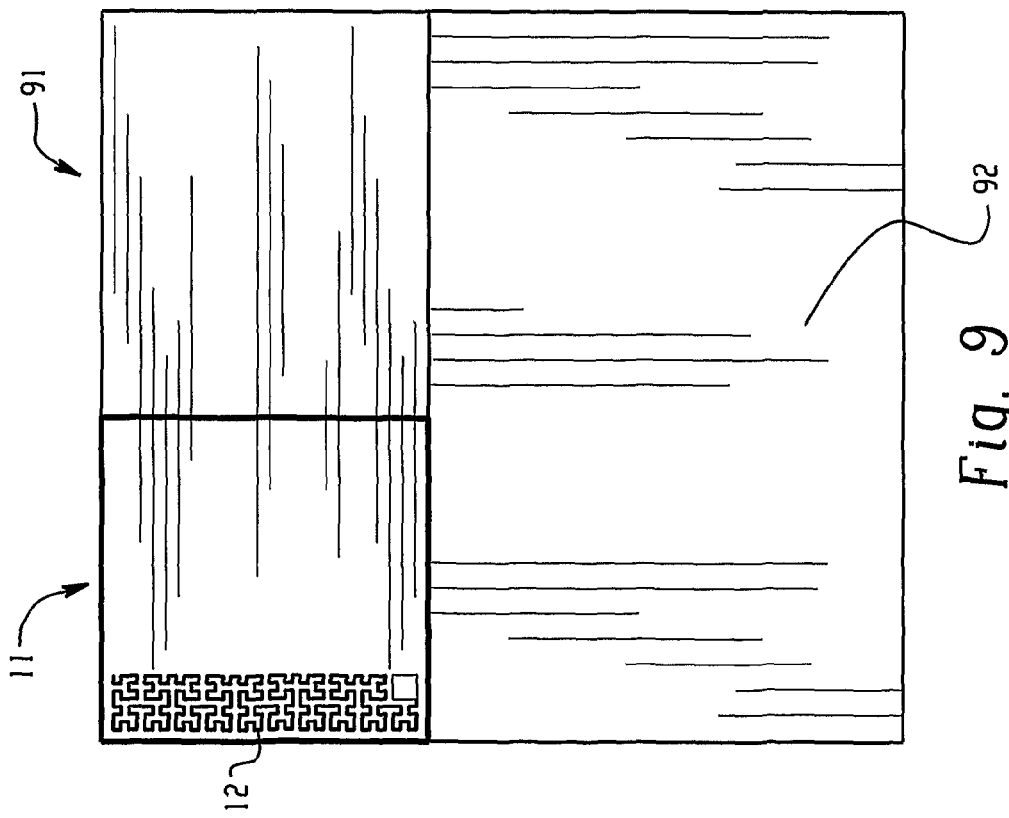
FIG. 9 is a schematic view of an example IC package containing an antenna placed on a PCB including a ground plane.
Figure 11:
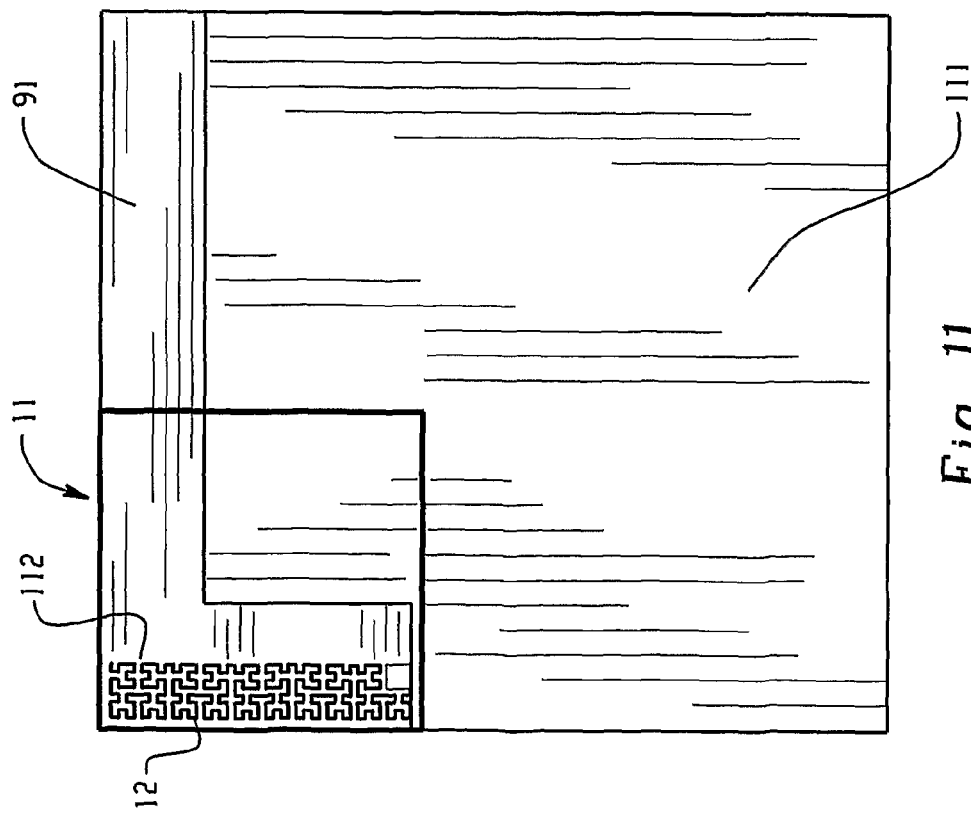
FIG. 11 is a schematic view of an example IC package on a PCB where a ground plane is arranged so that the surface of the ground plane is maximized while keeping a distance between it and the end of the antenna.

FIGS. 9-11 show a IC package 11 that incorporates an antenna 12 having a projection with a rectangular form. In these examples, a part of the ground plane 92 of the PCB 91 could be located in the projection of the IC package 11 on the PCB 91, but preferably not in the projection of the antenna 12.

FIG. 9 shows an embodiment illustrating an advantageous position of a IC package 11 having a rectangular antenna 12 along its left side, with respect to the PCB 91.

FIG. 10 shows an example illustrating how the part of the PCB 91 having a ground plane 92 is maximized while keeping the interaction between antenna 12 and ground plane 92 to a minimum. The ground plane 92 has two protrusions 101, 102. Protrusion A 101 falls inside the IC package 11 while protrusion B 102 is beside the IC package 11. The distance between protrusions A 101 and B 102 serves to minimize the interaction between the external ground plane 92 and the antenna 12.

FIG. 11 shows an example where the ground plane 111 is arranged so that the surface of the ground plane 111 is maximized while keeping a distance between it and the end of the antenna 112.

Figure 12:
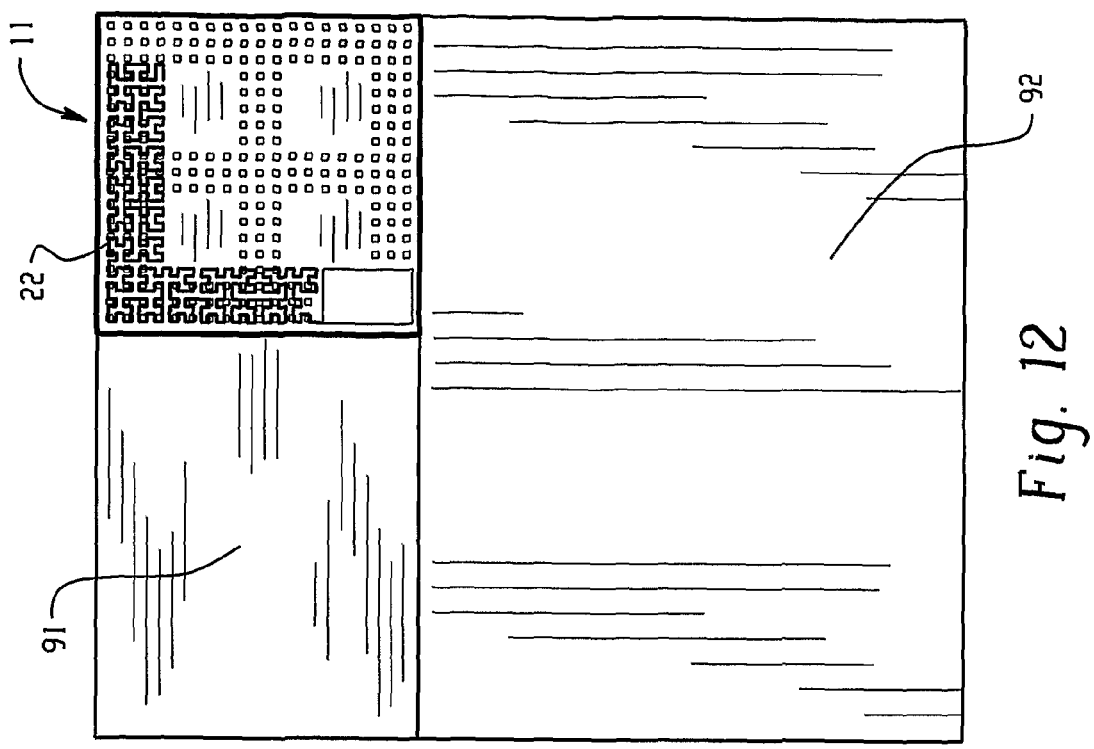
FIG. 12 is a schematic view of an example IC package including an L-Shaped antenna positioned in a PCB that includes a ground plane.

FIG. 12 shows an example of an IC package containing an L-shaped Hilbert Space-Filling antenna 22 and placed in a PCB 91 with an area of the PCB 91 free from the ground plane 92. Although a space-filling antenna 22 has been used in the example of FIG. 12, in other examples, other types of antennas could also be used. The position of the IC package 11 containing the antenna 22 in the upper right-hand corner with respect to the PCB 91 is preferred.

Figure 13:
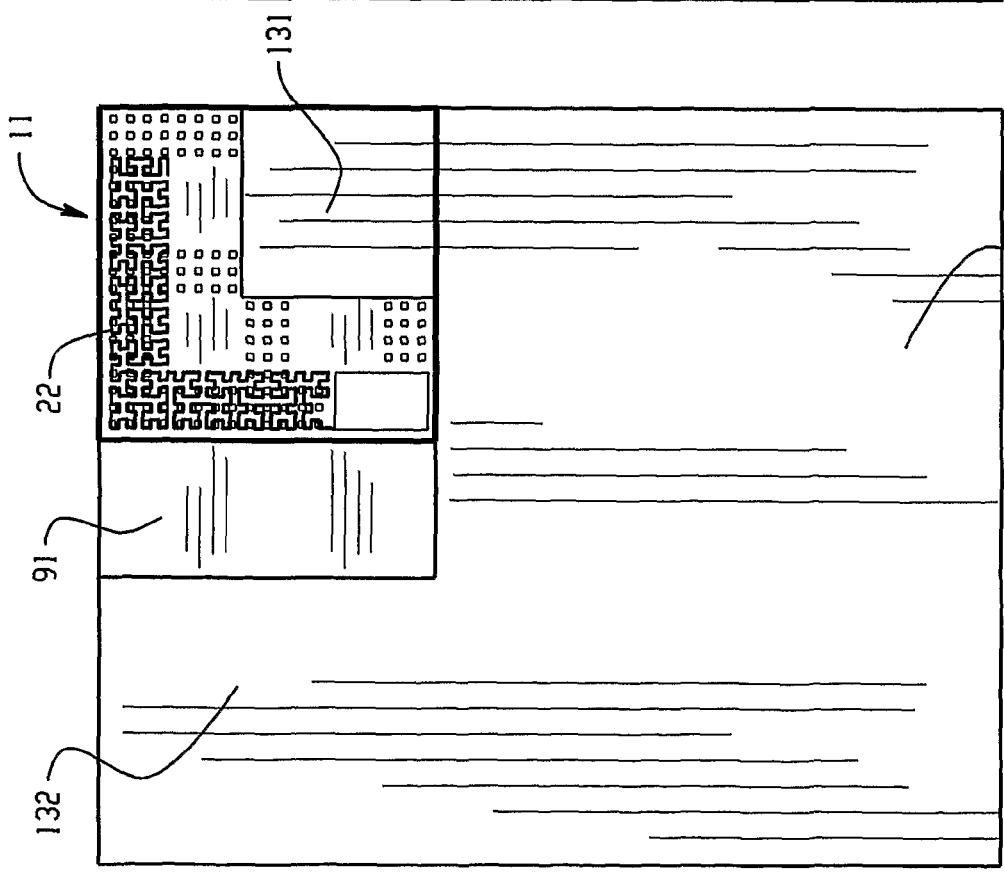
FIG. 13 is a schematic view of an example IC package in a PCB including a PCB ground plane that falls inside the projection of the IC package and wherein the surface of the PCB ground plane is maximized.

FIG. 13 shows an example where the part of the PCB 91 having a ground plane 92 is maximized while keeping the interaction between the antenna 22 on the IC package 11 and the ground plane 92 to a minimum. Protrusion A 131 falls inside the projection of the IC package 11 while protrusion B 132 is located a distance away from the antenna 22 outside the IC package 11.

Figure 14:
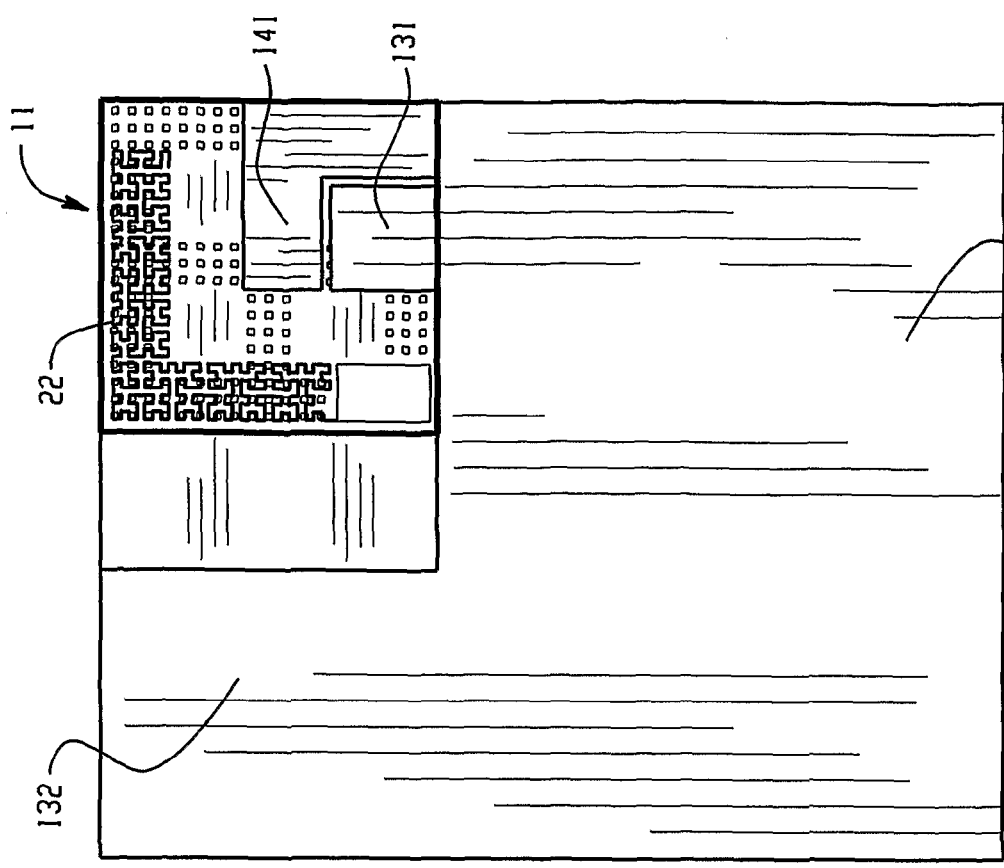
FIG. 14 is a schematic view of an example IC package including two internal ground planes, one of which is a part of, or coupled to, the PCB ground plane.

FIG. 14 shows an example where the IC package 11 includes two internal ground planes 131, 141: one ground plane 131 that is part of, or coupled to, the PCB ground plane 92 and another ground plane 141 that is independent from the PCB ground plane 92. Both ground planes 131, 141 are situated at a distance from the antenna 22. One of the ground planes can perform the function of an RF ground plane, while the other can function as a digital ground plane.

Figure 15:
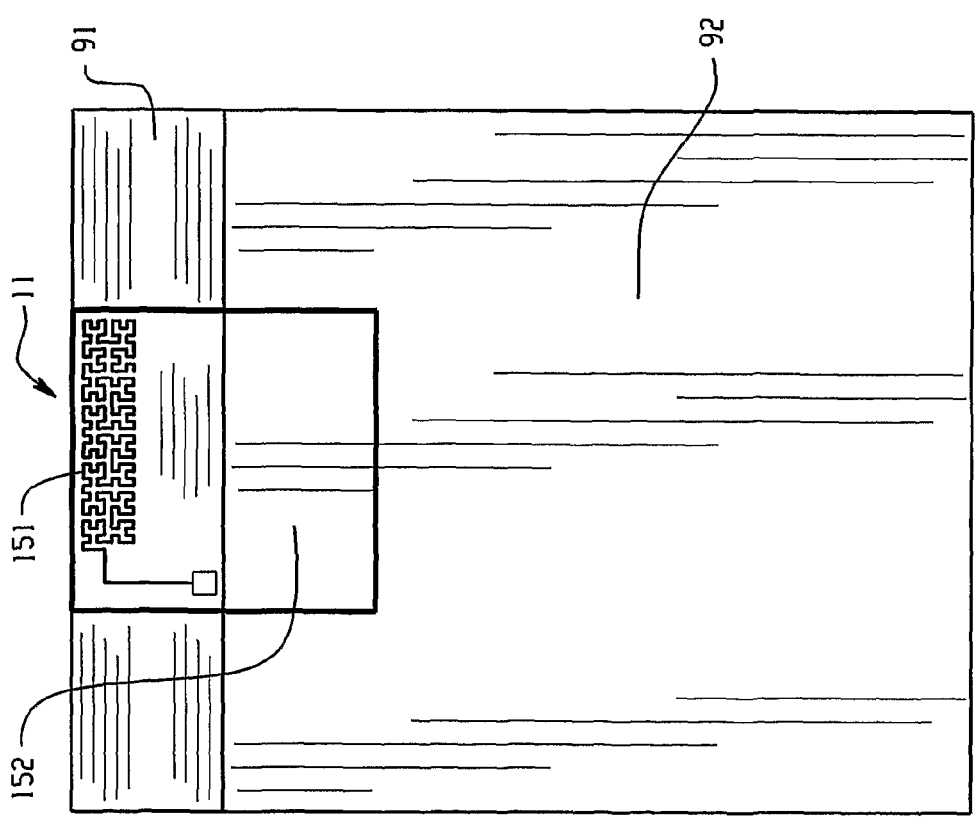
FIG. 15 is a schematic view of an example IC package where a "horizontal antenna" is located in an advantageous position with respect to a PCB that includes a ground plane that serves as an internal ground plane.

FIG. 15 shows an example of an IC package 11 that is positioned in the middle near the top edge with respect to a PCB 91. The IC package 11 contains an antenna 151 disposed in an horizontal position. The inner ground plane 152 of the IC package 11 is also part of, or coupled to, the PCB ground plane 92.

Figure 16:
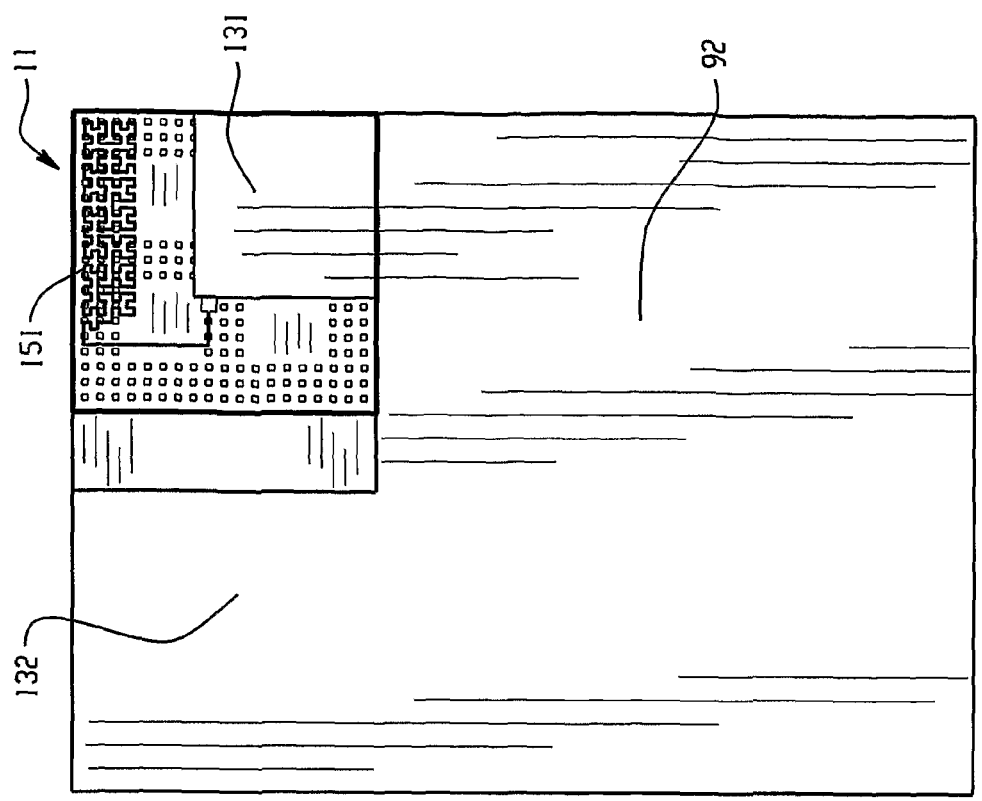
FIG. 16 is a schematic view of an example IC package on a PCB, where a portion of the PCB ground plane is in the projection of the IC package, and the surface of the PCB ground plane is maximized.

FIG. 16 shows an example of an IC package 11 where the part of the PCB having a ground plane 92 is maximized while the interaction between the antenna 151 and ground plane 92 is kept to a minimum. Protrusion A 131 falls inside the projection of the IC package while protrusion B 132 is located at a distance from the antenna 151. The antenna 151 is located in a horizontal position with respect to the IC package 11.

Figure 17:
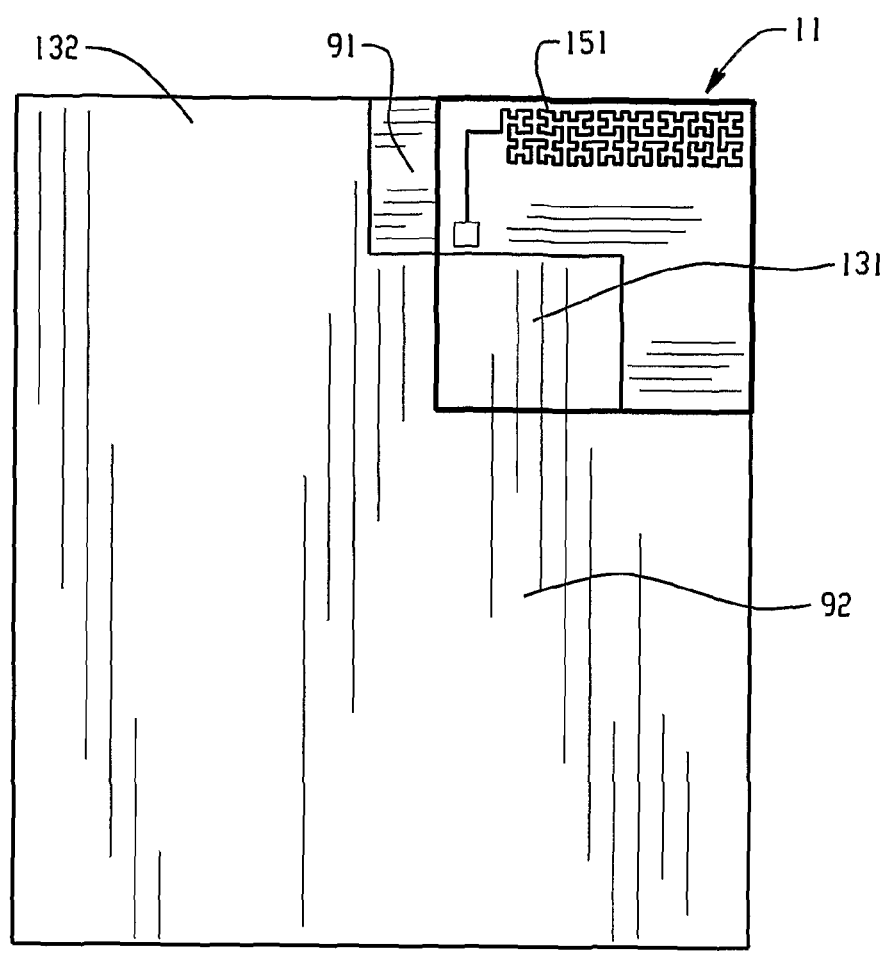
FIG. 17 is a schematic view of an example IC package where the surface of the PCB including a ground plane is maximized while a part of the PCB ground plane is in the projection of the IC package.

FIG. 17 shows another example of a IC package 11 where the part of the PCB having a ground plane 92 is maximized while the interaction between the antenna 151 and ground plane 92 is kept to a minimum. Protrusion A 131 falls inside the projection of the IC package while protrusion B 132 is located at a distance from the antenna 22. This arrangement is advantageous because the clearance on the PCB 91 outside the IC package 11 is minimized, allowing a smaller PCB 91 and more space for other components.

Another possibility for preventing decreased performance of the antenna 22 is to use a shielding to isolate a certain part or subsystem of the IC package from the antenna 22. This isolated part of the IC package 11 could be, for example, a pad, track, a ground plane, a circuit, or a silicon part which could be a die.

Figure 18:
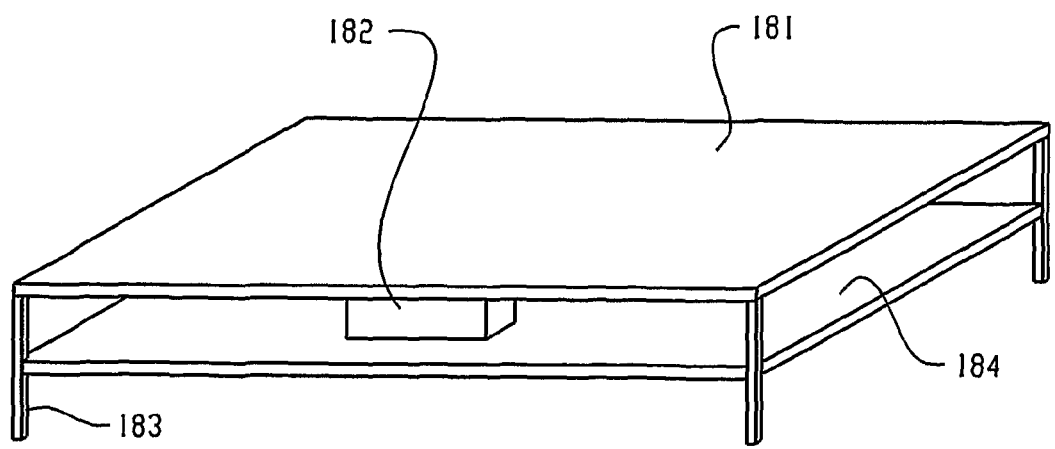
FIG. 18 is a perspective view of an example device with conductive plates on top and underneath the part or subsystem of an IC package to be isolated.

FIG. 18 shows an example where the part or subsystem 182 of the IC package to be electrically isolated (the entire IC package is not shown to enhance the clarity of FIG. 18) is placed between a lower 184 and an upper 181 metallic conductive piece which covers the die projection. Both plates are electrically connected by means of legs 183. The overall shielding structure might be connected to ground in some examples. A part of the lower 184 or upper metallic pieces 181 may have a hole in some examples, so that pads would provide an electrical connection through the lower conductive part.

Figure 19:
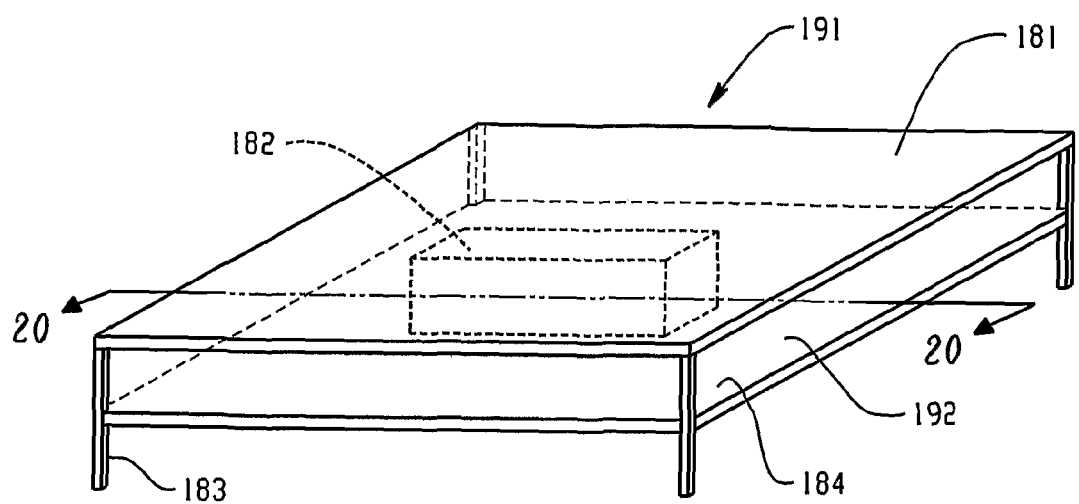
FIG. 19 is a partial see-through, perspective view of an example shielding for a part or subsystem of an IC package to be isolated in the form of a cage.

FIG. 19 shows a see-through view of an example shielding arrangement 191 similar to that of FIG. 18 with one conductive part over the part or subsystem 182 of the IC package to be isolated. However, in this example, lateral walls 192 as well as upper 181 and lower parts 184, surround the isolated part 182 of the IC package. Legs 183 are incorporated in the corners of the cage. These legs 183 might serve to connect lateral walls 192 with the upper 181 and lower parts 184. In addition, legs 183, in some examples, serve to connect the shielding structure to ground. This ground could be the ground plane 201 situated in one of the PCB 202 layers, as shown in FIG. 20.

Figure 20:
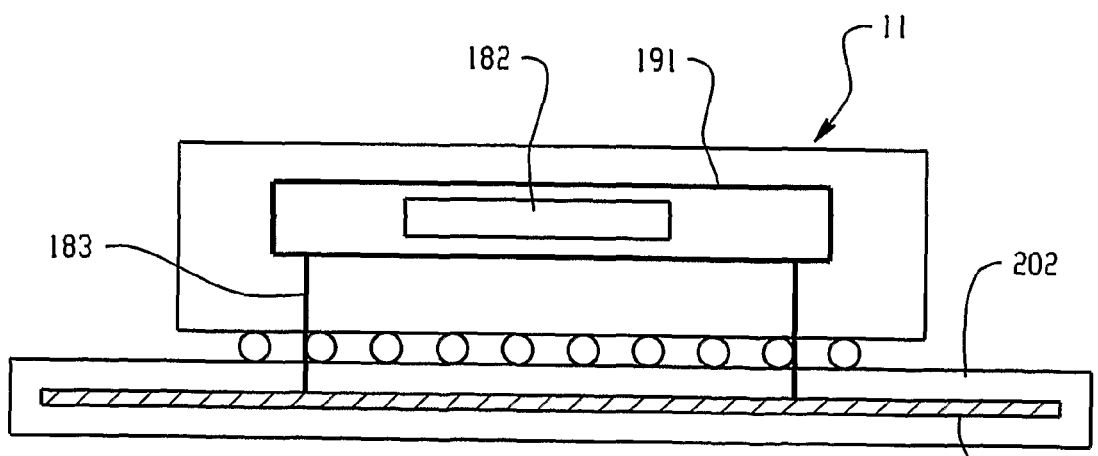
FIG. 20 is a cross-sectional view taken along the axis 20-20 of the example shielding of FIG. 19 included in a package.

FIG. 20 is a sectional view of the shielding arrangement 191 of FIG. 19 located inside the IC package 11. The part or subsystem of the IC package to be isolated 182 is located inside the shielding arrangement 191. The legs 183 are connected to the PCB 202 ground plane 201.

Figure 21:
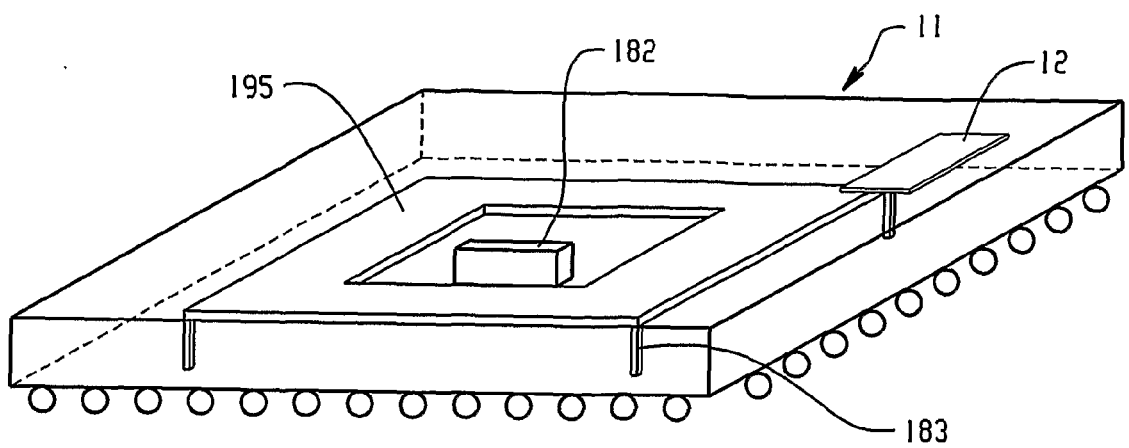
FIG. 21 is a partial see-through, perspective view of an example device including a conductive plate with a central aperture where the part or subsystem of the IC package to be isolated is located.

FIG. 21 shows an example of an IC package 11 that includes a conductive plate 195 with a central aperture where the part or subsystem 182 of the IC package to be isolated is located. Legs 183, in some examples connect the conductive part which serves as a shielding to ground. The shielding would preferably not be placed in the antenna projection.

Figure 22:
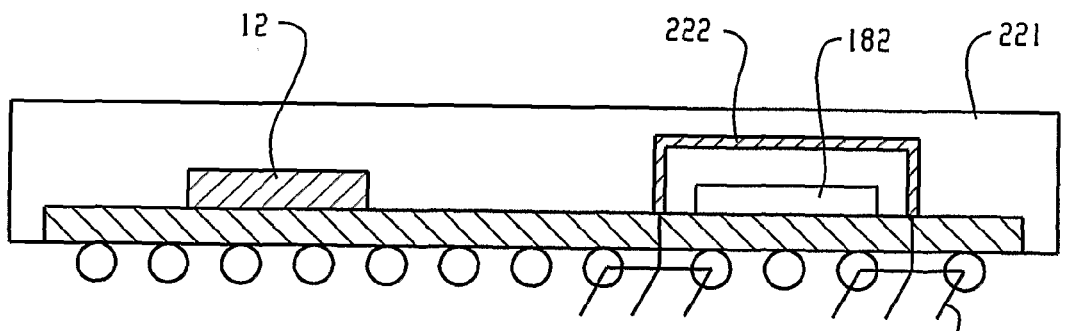
FIG. 22 is a cross-sectional view of an example part or subsystem of an IC package to be isolated that is overmolded and shielded by means of a conductive paint.
Figure 22B:
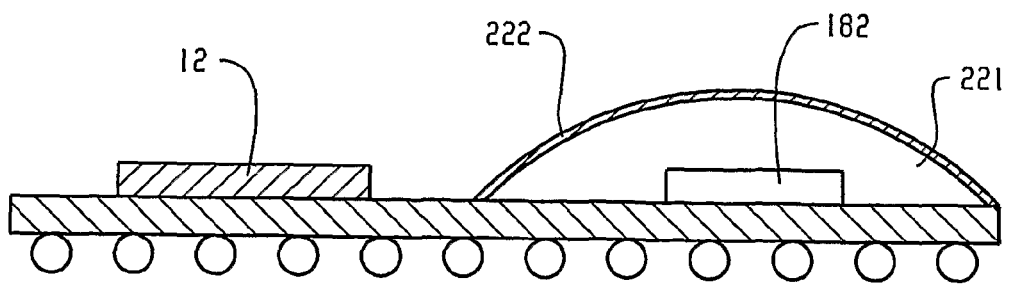
FIG. 22b is a cross-sectional view of an example part or subsystem of an IC package to be isolated being overmolded and covered by a conductive paint.

FIG. 22 illustrates an example where the part or subsystem 182 of the IC package to be isolated is located in a cavity formed by an overmold 221. The interior wall of the cavity is covered by a metallic paint 222 and this paint 222 is connected to ground 223. FIG. 22b shows an example where the overmold 221 is physically in contact with the part or subsystem to be isolated 182 and a metallic paint 222 covers the exterior surface of the overmold 221. This metallic paint 222 is also connected to ground.

Any of the conductive surfaces mentioned above could be replaced by a grid where the distance between the stripes which form the grid is not more than one-tenth of the free space operating wavelength of the antenna. These wires could define a shielding arrangement cage such as that shown in FIG. 19.

In other examples, any of the shieldings mentioned above would cover only partially the part or subsystem 182 of the IC package to be isolated.

Figure 23A:
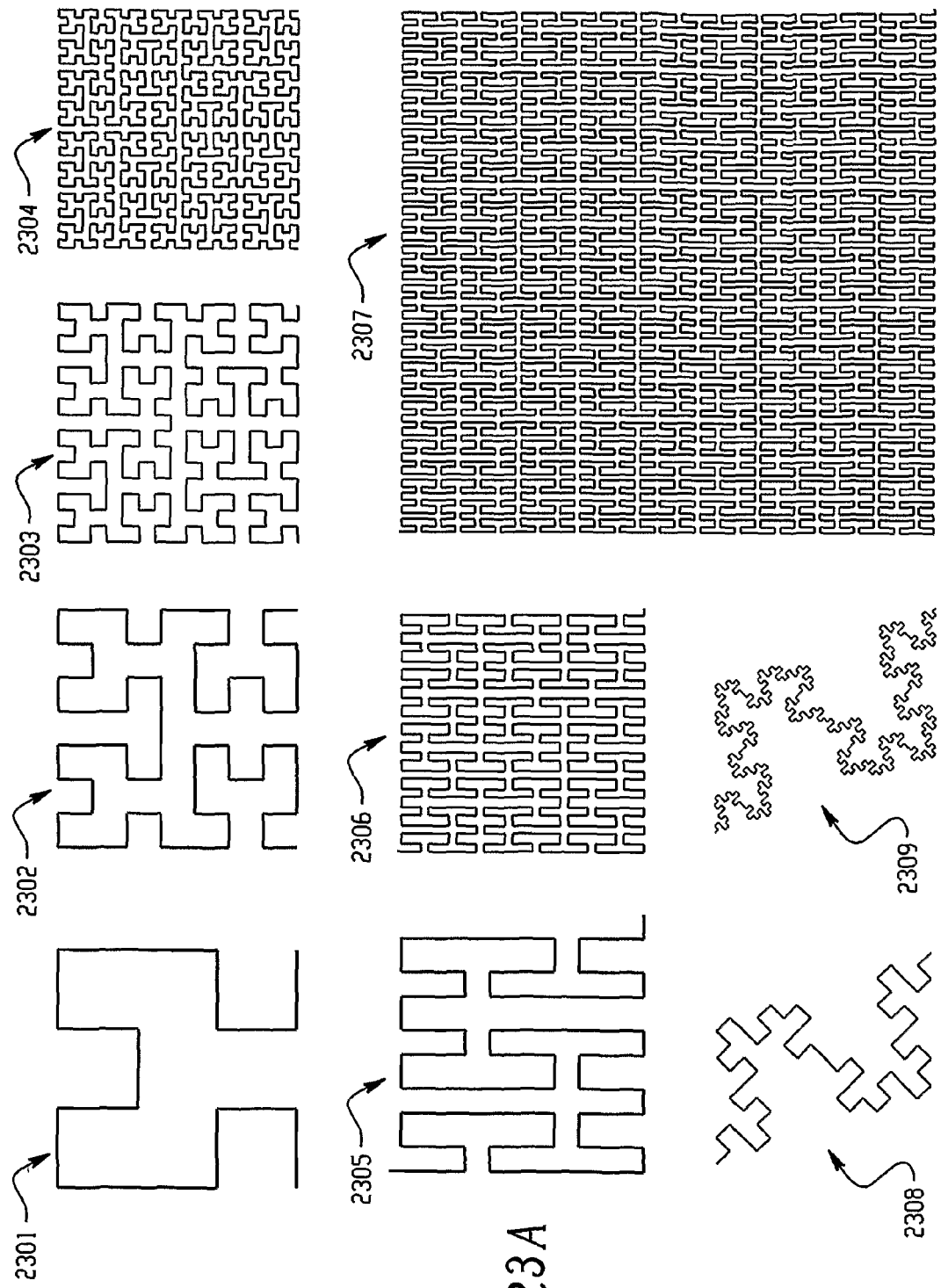
FIG. 23 shows diagrams of different types of example space-filling, grid dimension, and box-counting curves.
Figure 23B:
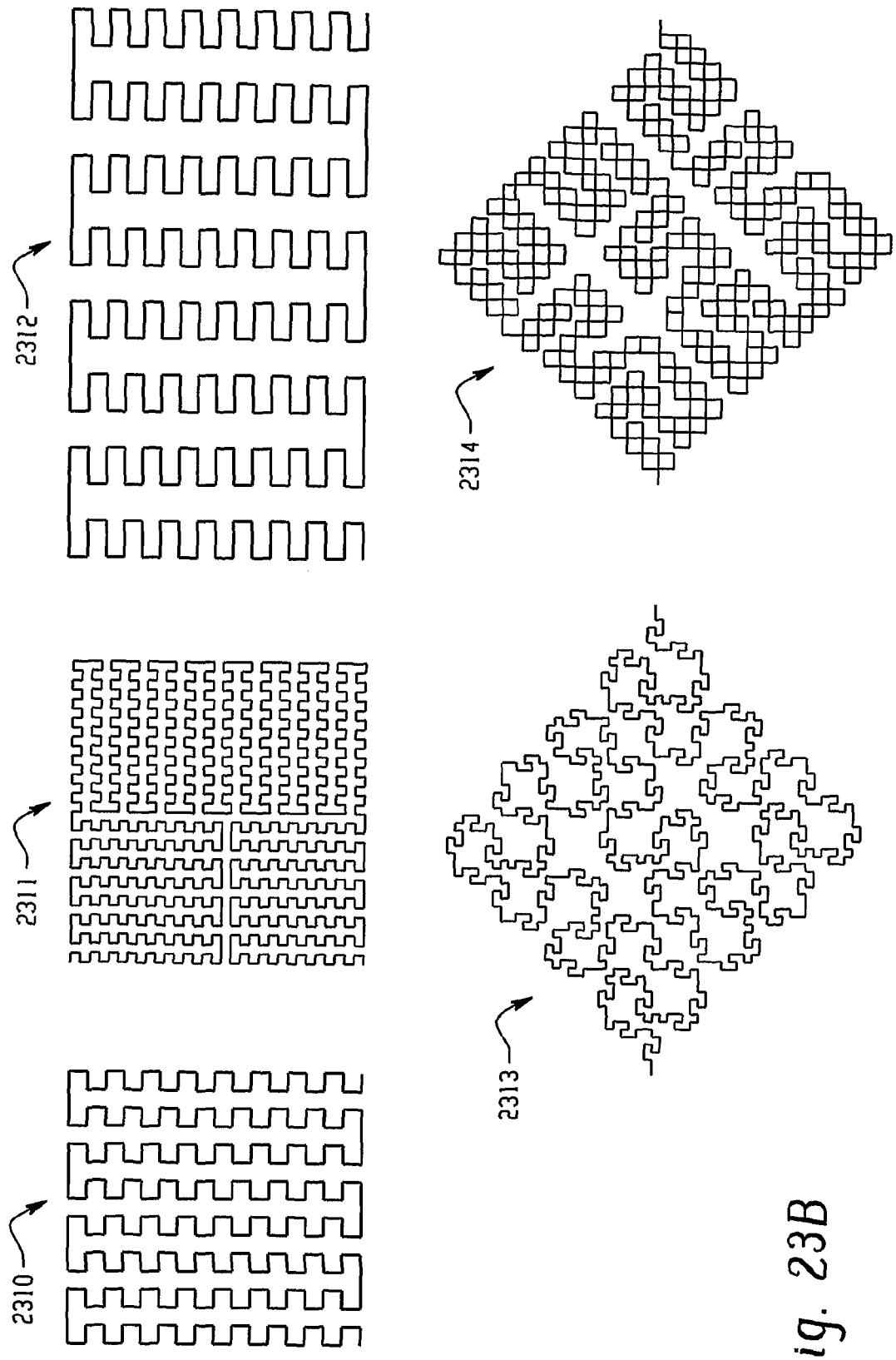

FIG. 23 shows examples of space filling curves. Space filling curves 2301 through 2314 are examples of space filling curves for antenna designs. Space-filling curves fill the surface or volume where they are located in an efficient way while keeping the linear properties of being curves. A Space-filling curve is a non-periodic line composed by a number of connected straight segments smaller than a fraction of the operating free-space wave length of the antenna, where the segments are arranged so that none of the adjacent and connected segments form another longer straight segment and none of the segments intersect with each other. Typically, the fraction of the operating wavelength is one-tenth or smaller.

In another example, a space-filling curve may have one or more non-straight segments smaller than a fraction of the operating free-space wave length of the antenna, where the segments are arranged so that none of the adjacent and connected segments form another longer segment and none of the segments intersect with each other.

A grid dimension curve is a curve having a grid dimension greater than one according to the below equation.

$$D_g = -\frac{\log(N2) - \log(N1)}{\log(2 \times L1) - \log(L1)}$$

Figure 24:
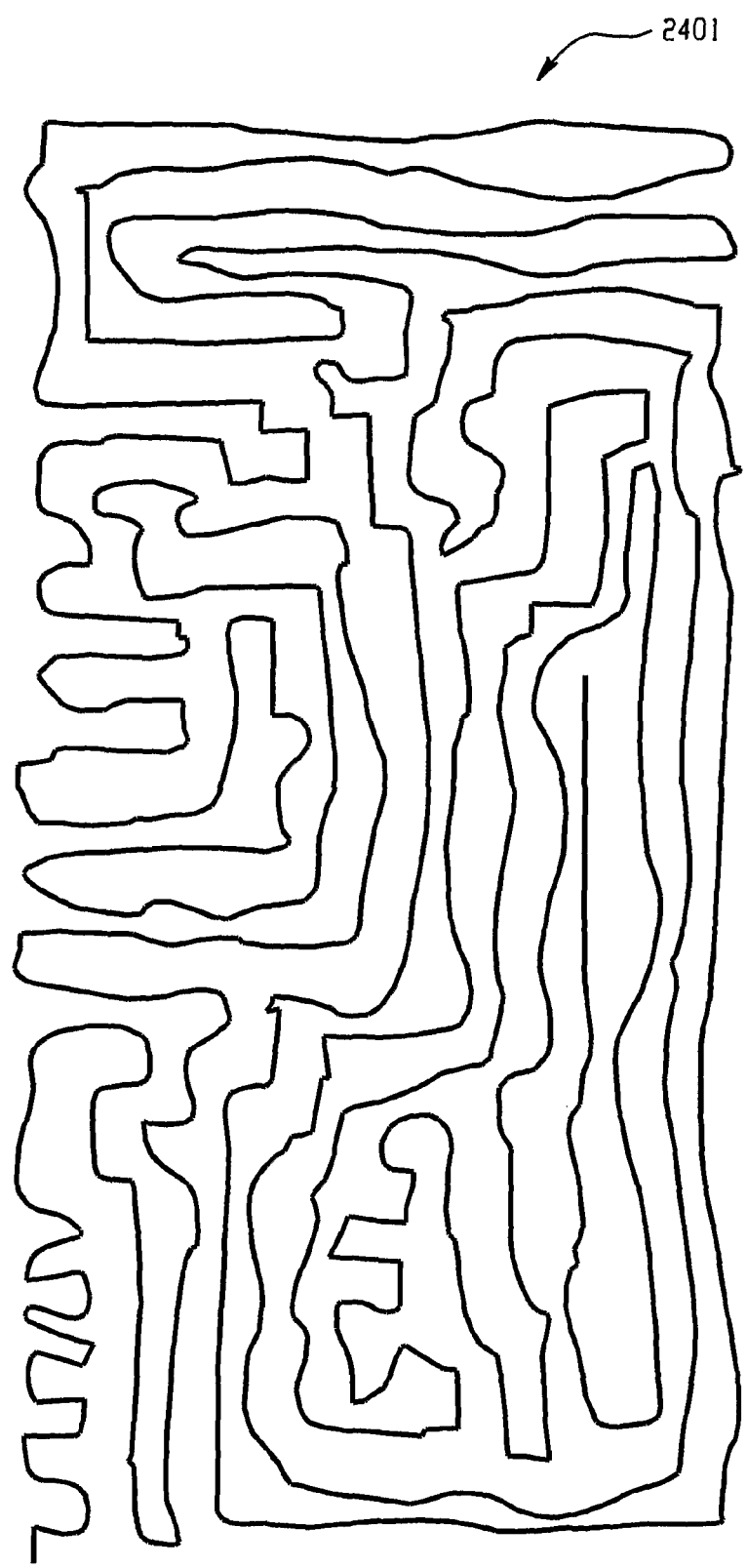
FIG. 24 shows a diagram of an example of a grid dimension curve.
Figure 25:
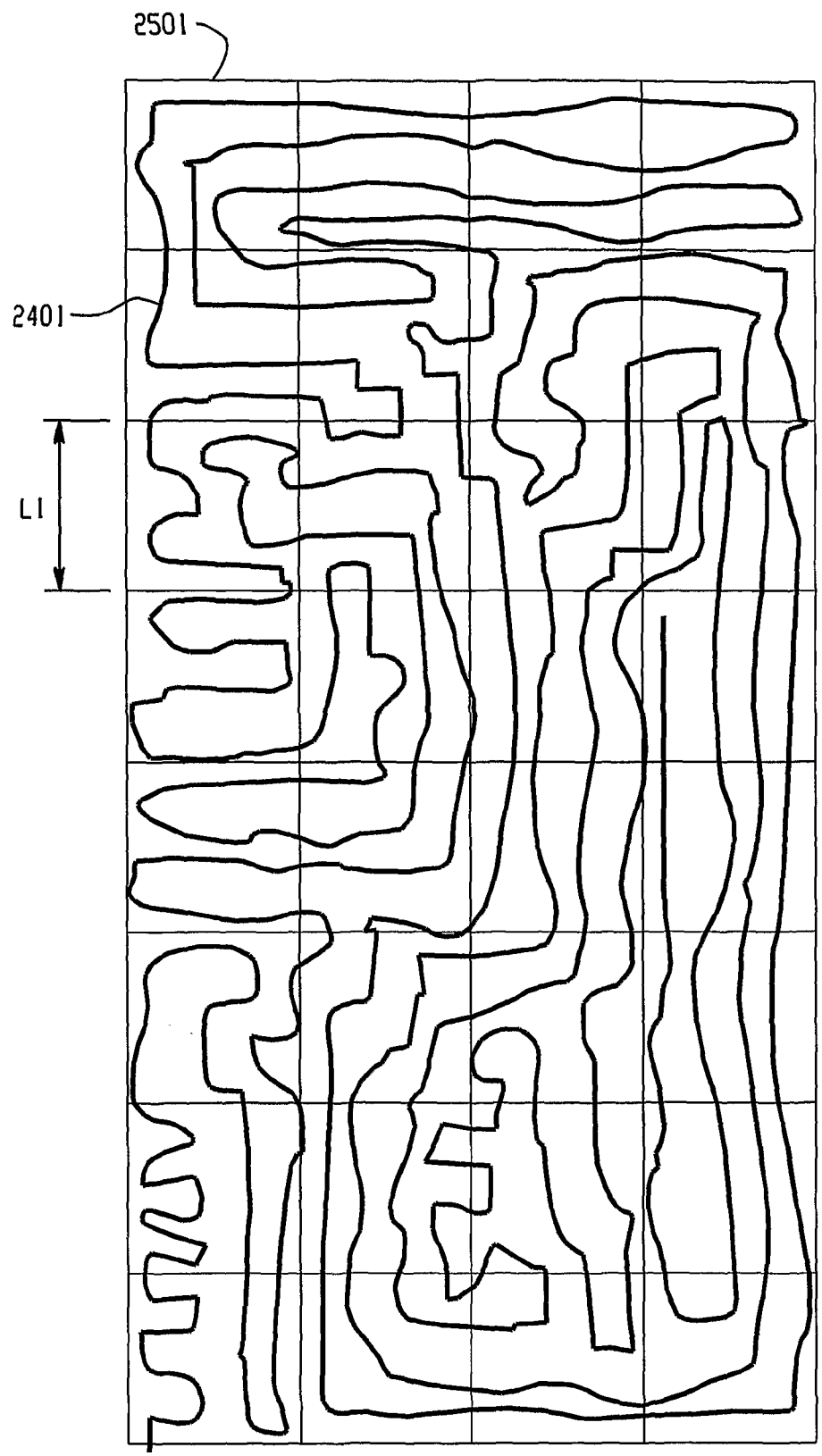
FIG. 25 shows a diagram of an example of a grid dimension curve located in a first grid.
Figure 26:
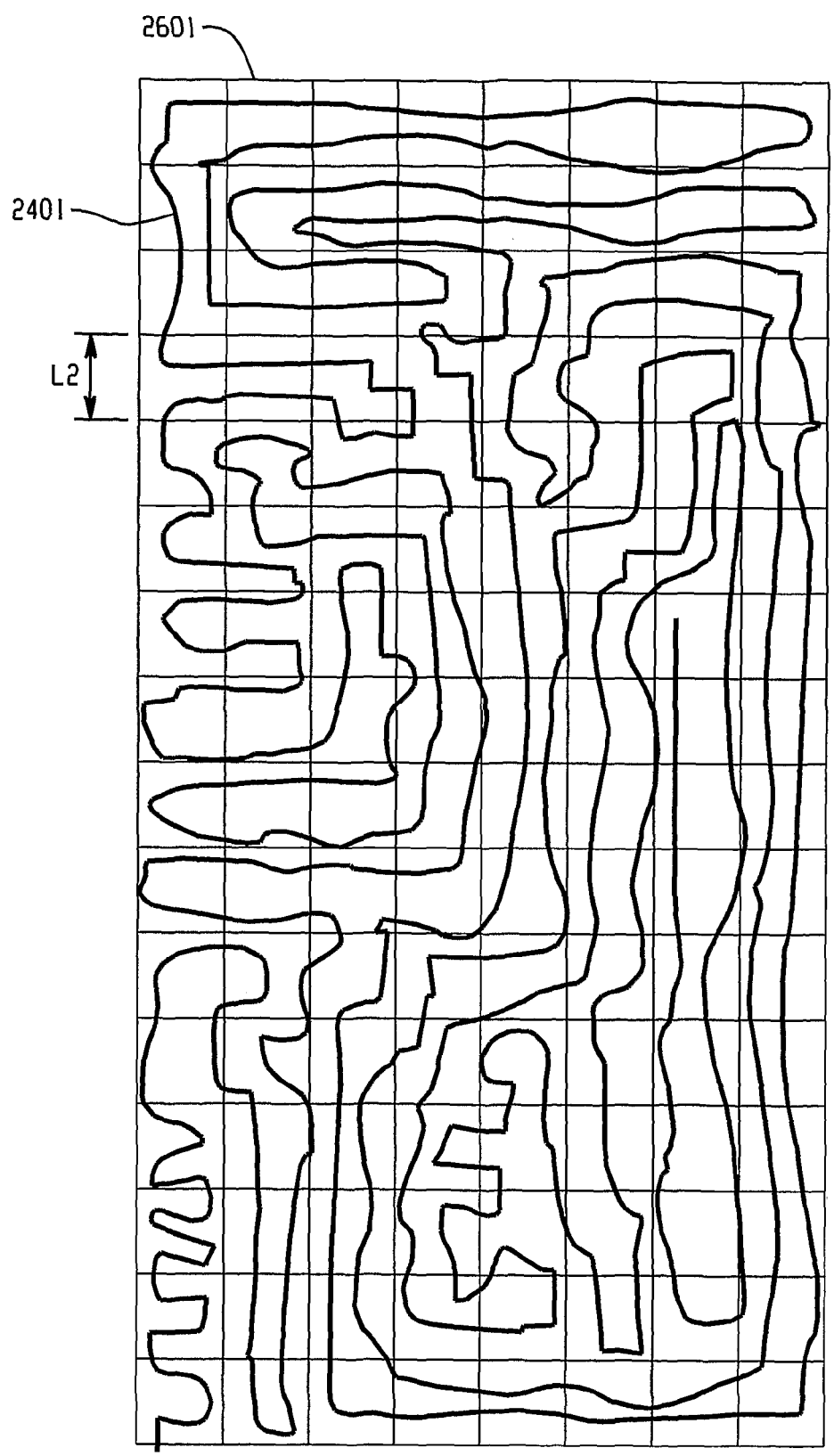
FIG. 26 shows a diagram of an example of a grid dimension curve located in a second grid.

FIG. 24 shows an example of a two-dimensional antenna 2401 forming a grid dimension curve with a grid dimension of approximately two. FIG. 25 shows the antenna 2401 of FIG. 24 enclosed in a first grid 2501 having thirty-two 32 square cells, each with a length L1. The number of cells (N1) in the first grid that enclose at least a portion of the curve are counted. FIG. 26 shows the same antenna 2401 enclosed in a second grid 2601 having one hundred twenty-eight (128) square cells, each with a length L2. The number of cells (N2) in the second grid that enclose at least a portion of the curve are also counted. The length (L1) of each square cell in the first grid 2501 is twice the length (L2) of each square cell in the second grid 2601 (L2=2×L1).

An examination of FIG. 25 and FIG. 26 reveals that at least a portion of the antenna 2401 is enclosed within every square cell in both the first and second grids 2501, 2601. Therefore, the value of N1 in the above grid dimension (Dg) equation is thirty-two (i.e., the total number of cells in the first grid 2501), and the value of N2 is one hundred twenty-eight (i.e., the total number of cells in the second grid 2601). Using the above equation, the grid dimension of the antenna 2401 may be calculated as follows:

$$D_g = -\frac{\log(128) - \log(32)}{\log(2 \times L1) - \log(L1)} = 2$$

For a more accurate calculation of the grid dimension, the number of square cells may be increased up to a maximum amount. The maximum number of cells in a grid is dependant upon the resolution of the curve. As the number of cells approaches the maximum, the grid dimension calculation becomes more accurate. If a grid having more than the maximum number of cells is selected, however, then the accuracy of the grid dimension calculation begins to decrease. Typically, the maximum number of cells in a grid is one-thousand.

Figure 27:
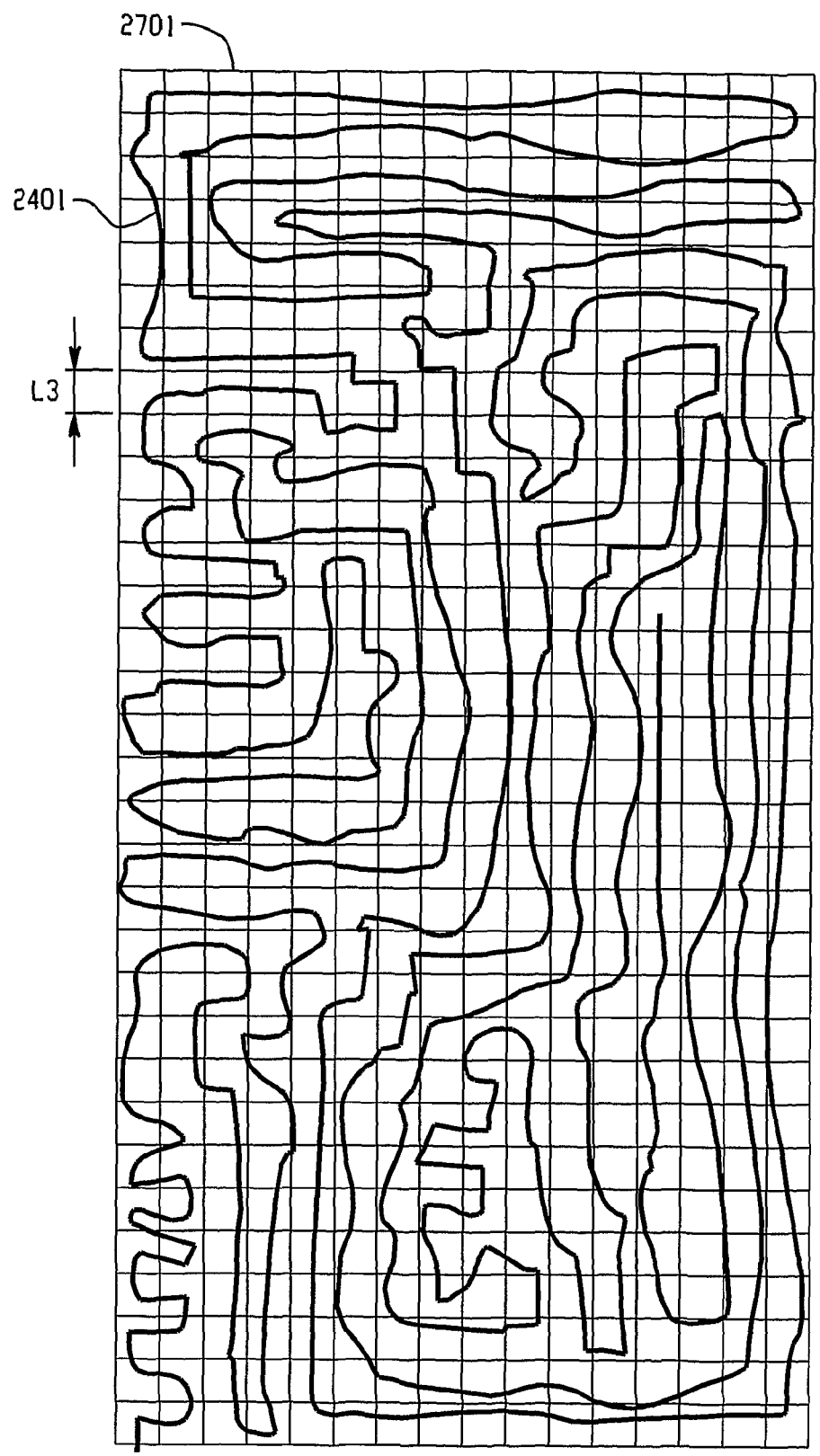
FIG. 27 shows a diagram of an example of a grid dimension curve located in a third grid.

For example, FIG. 27 shows the same antenna 2401 enclosed in a third grid 2701 with five hundred twelve (512) square cells, each having a length L3. The length (L3) of the cells in the third grid is one-half the length (L2) of the cells in the second grid, shown in FIG. 26. As noted above, a portion of the antenna 2401 is enclosed within every square cell in the second grid 2601, thus the value of N for the second grid 2601 is one hundred twenty-eight (128). An examination of FIG. 27, however, reveals that the antenna 2401 is enclosed within only five-hundred nine of the five-hundred twelve cells of the third grid 2701. Therefore, the value of N for the third grid 2701 is five-hundred nine. Using FIG. 25 and FIG. 26, a more accurate value for the grid dimension ($D_g$) of the antenna 2401 may be calculated as follows:

$$D_g = -\frac{\log(509) - \log(128)}{\log(2 \times L2) - \log(L2)} \approx 1.9915$$

A similar concept to that of the grid dimension is the box counting dimension concept. A box counting antenna has a conducting pattern, at least a portion of which includes a curve, and the curve comprises at least five segments. Each of the at least five segments forms an angle with each adjacent segment in the curve, and at least three of the segments are shorter than one-tenth of the longest free-space operating wavelength of the antenna. Each angle between adjacent segments is less than 180°, at least two of the angles between adjacent sections are less than 115°, and at least two of the angles are not equal. The curve fits inside a rectangular area, the longest side of the rectangular area being shorter than one-fifth of the longest free-space operating wavelength of the antenna.

For a given geometry lying on a surface, the box-counting dimension is computed in the following way. First, a grid with cells of size L1 is placed over the geometry, so that the grid completely covers the geometry, and the number of boxes N1 that include at least a point of the geometry are counted. Second, a grid with boxes of size L2 (where L2 is smaller than L1) is also placed over the geometry, so that the grid completely covers the geometry, and the number of boxes N2 that include at least a point of the geometry are counted again. The box-counting dimension D is then computed as:

$$D = -\frac{\log(N2) - \log(N1)}{\log(L2) - \log(L1)}$$

The box-counting dimension is computed by placing the first and second grids inside the minimum rectangular area enclosing the curve of the antenna and applying the above algorithm.

Figure 28:
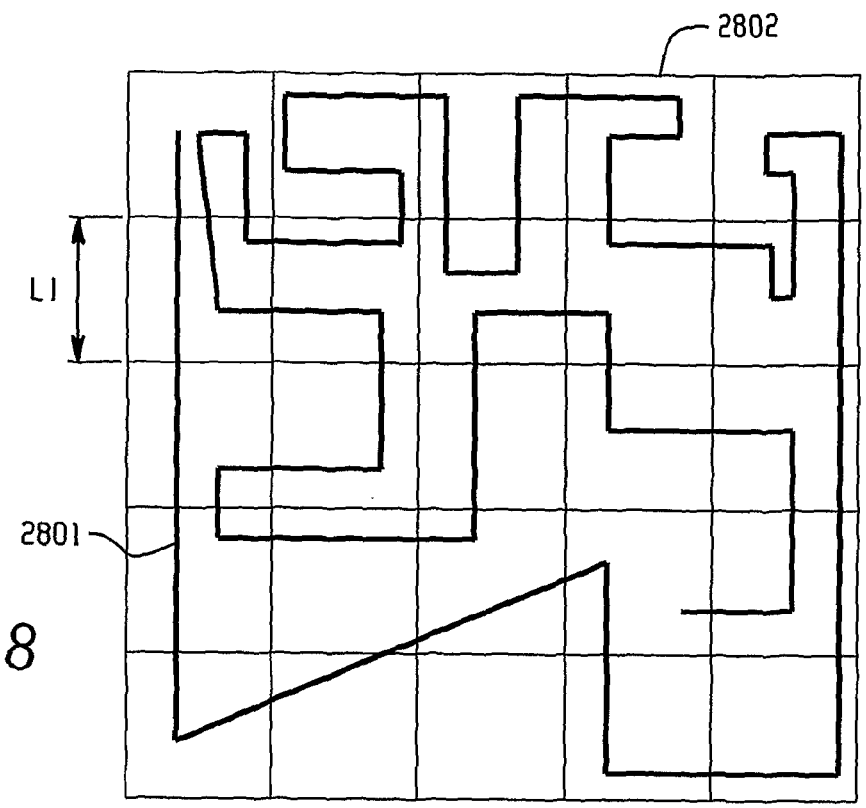
FIG. 28 shows a diagram of an example of a box counting curve located in a first curve.
Figure 29:
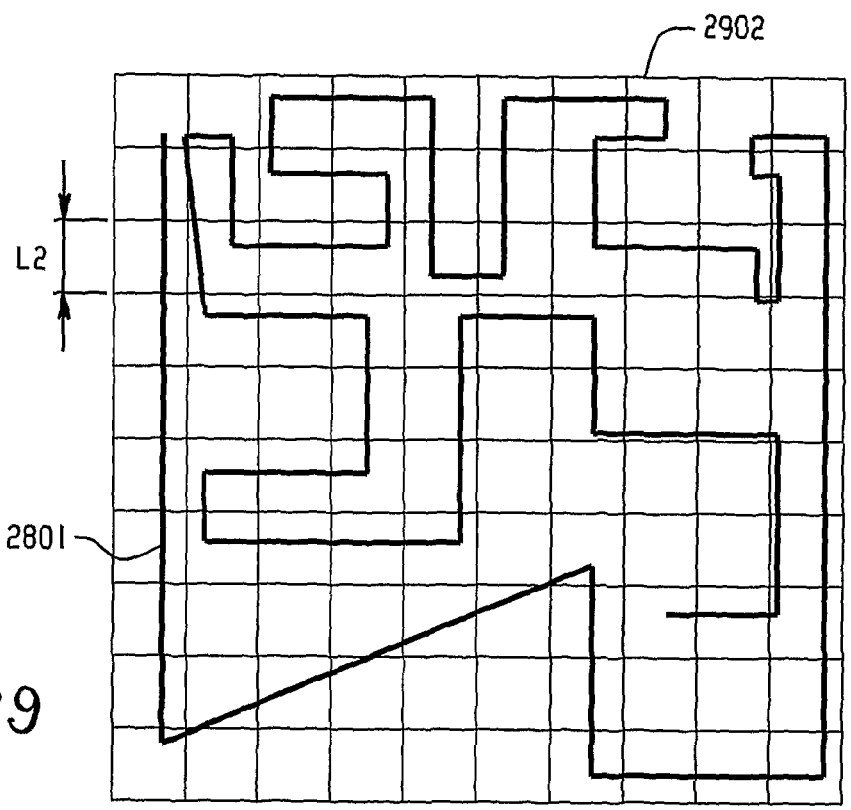
FIG. 29 shows a diagram of an example of a box counting curve located in a second grid.

The first grid should be chosen such that the rectangular area is meshed in an array of at least five-by-five boxes or cells, and the second grid where L2=½ L1 is chosen so that the second grid includes at least ten-by-ten boxes. An example of this is shown in FIG. 28 and FIG. 29. The minimum rectangular area means an area where there is not an entire row or column on the perimeter of the grid that does not contain any piece of the curve. Thus, some of the examples may include a box-counting dimension larger than 1.17, and in those applications where the required degree of miniaturization is higher, the designs may feature a box-counting dimension ranging from 1.5 up to 2, inclusive. For some embodiments, a curve having a box-counting dimension of about 2 is preferred. For very small antennas, that fit, for example, in a rectangle of maximum size equal to one-twentieth of the longest free-space operating wavelength of the antenna, the box-counting dimension may be necessarily computed with a finer grid. In those cases, the first grid will be taken as a mesh of ten-by-ten equal cells, while the second grid will be taken as a mesh of twenty-by-twenty equal cells, and then $D_g$ is computed according to the equation above. In the case of small packages with planar designs, i.e., designs where the antenna is arranged in a single layer on a package substrate, it is preferred that the dimension of the curve included in the antenna geometry have a value close to D=2.

In general, for a given resonant frequency of the antenna, the larger the box-counting dimension, the higher the degree of miniaturization that will be achieved by the antenna. One way of enhancing the miniaturization capabilities of the antenna is to arrange the several segments of the curve of the antenna pattern in such a way that the curve intersects at least one point of at least fourteen boxes of the first grid with five-by-five boxes or cells enclosing the curve. Also, in other embodiments where a high degree of miniaturization is required, the curve crosses at least one of the boxes twice within the five-by-five grid, that is, the curve includes two non-adjacent portions inside at least one of the cells or boxes of the grid.

An example of how the box-counting dimension is computed is shown in FIG. 28 and FIG. 29. An example of a curve 2801 is placed under a five-by-five grid and under a ten-by-ten grid. As seen in the FIG. 28 graph, the curve 2801 touches N1=25 cells in grid 2802 while it touches N2=78 boxes in grid 2902. In this example, the size of the cells in grid 2802 is twice the size of the cells in 2902. By applying the equation above, it is found that the box-counting dimension of curve 2801 is, equal to D=1.6415. The curve 2801 crosses more than 14 of the 25 cells in grid 2802, and also the curve crosses at least one cell twice, that is, at least one cell contains two non-adjacent segments of the curve. In fact, 2801 is an example where such a double crossing occurs in 13 boxes out of the 25 in 2802.

Figure 31:
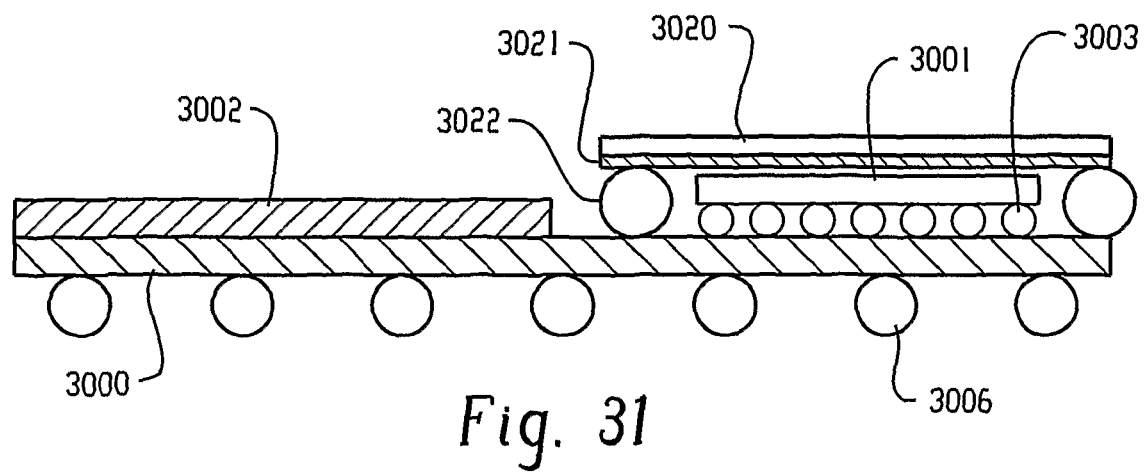
FIG. 31 shows a cross-sectional view of an example package with a semi-conductor die attached to the substrate of the package with a second substrate placed above the semi-conductor die.
Figure 32:
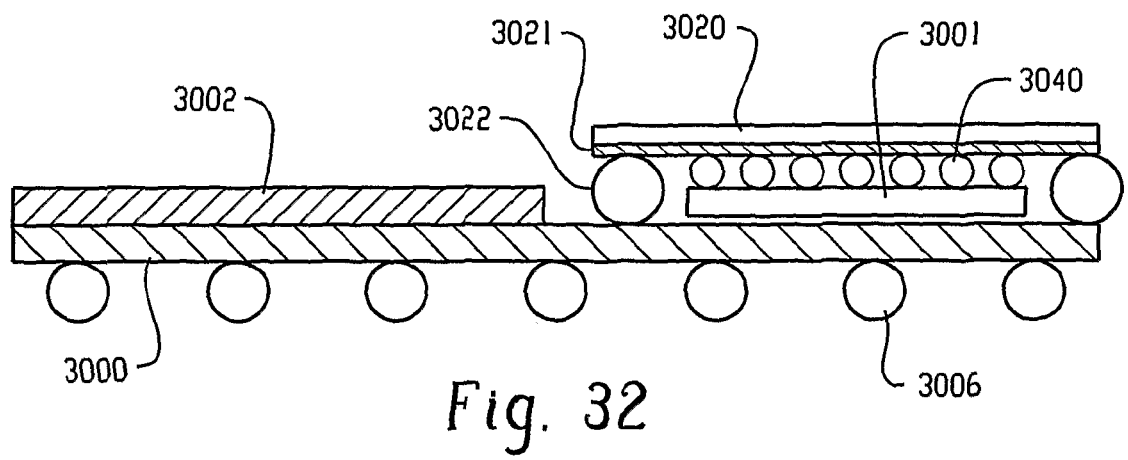
FIG. 32 shows a cross-sectional view of an example package having a first substrate and a second substrate that is placed above the first substrate of the package, and a semi-conductor die is attached by solder balls underneath the second substrate of the package.
Figure 33:
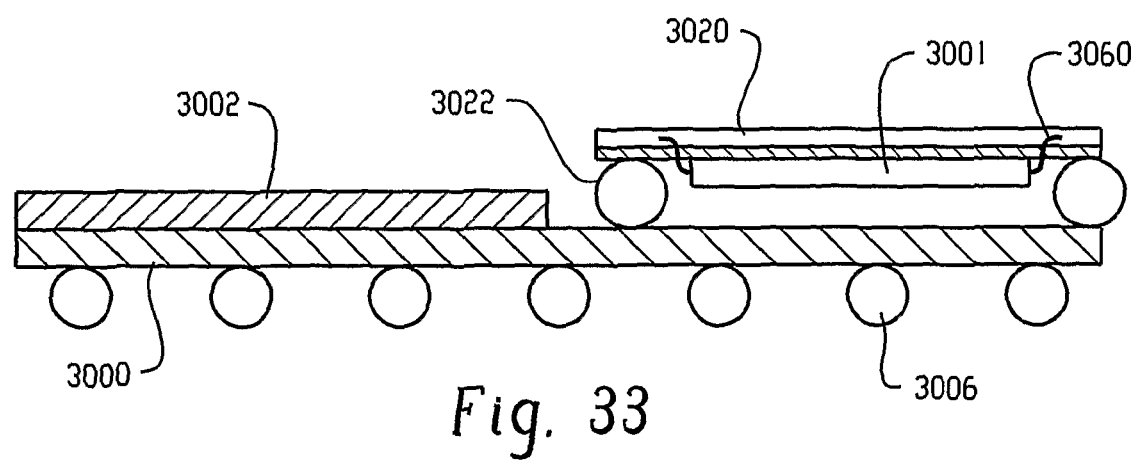
FIG. 33 shows a cross-sectional view of an example package having a first substrate and a second substrate that is placed above the first substrate of the package, and a semi-conductor die is attached by wire bonds underneath the second substrate of the package.

FIGS. 31 through 33 present some embodiments of a package comprising a substrate 3000, a semiconductor die 3001, and an antenna 3002. These figures show a cross-sectional view of example packages, which are BGA-type for illustration purposes in these examples. The example packages also comprise some additional elements to shield the semiconductor die 3001 from the electromagnetic radiation emitted by the antenna 3002 that is included in the package.

Figure 30:
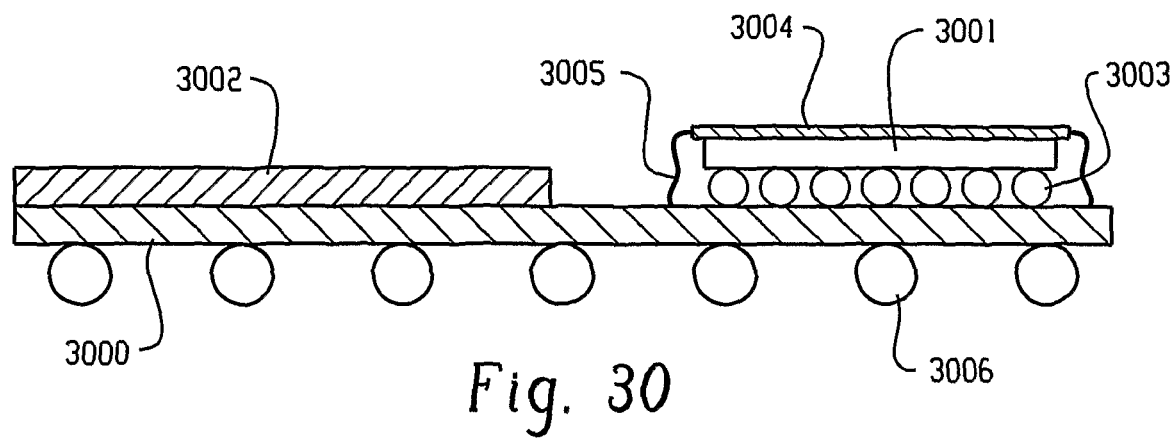
FIG. 30 shows a cross-sectional view of an example package with a semi-conductor die attached to the substrate of the package, and that is covered with a layer of conductive material.

In the example package of FIG. 30, the semiconductor die 3001 is connected to the substrate 3000 of the package by solder balls 3003. The semiconductor die 3001 has been covered with a layer of a conductive material 3004 which is then connected by one or several wire bonds 3005 to a ground plane. In some examples, it is advantageous to have a wire bond connecting to ground each one of the four corners of the conductive layer 3004. In some examples the ground plane is internal to the package; however, in other examples the ground plane is external to the package, for example, a conductive layer of the PCB on which the package is mounted may function as an external ground plane. In the latter, the wire bond 3005 will be connected to the external ground plane by means of a ball 3006, pad or pin of the substrate 3000 of the package.

FIG. 31 discloses another example in which a second substrate 3020 is located above the semiconductor die 3001. The second substrate 3020 includes a conductive layer 3021 that covers the semiconductor die 3001. The second substrate 3020 is connected to the first substrate 3000 by means of solder balls 3022, which have a mechanical function of acting as spacers and supporting the second substrate 3020, and an electrical function of connecting the conducting layer 3021 to a ground plane. In some examples the ground plane will be internal to the package, while in other examples it will be external to the package. In examples where the ground plane is external to the package, the substrate 3000 provides electrical continuity between a solder ball 3022 that is internal to the package and a solder ball 3006, pad or pin outside of the package.

FIG. 32 presents another example package similar to the example package of FIG. 31, but in which the semiconductor die 3001 has been flip-chip bonded to the second substrate 3020. In this particular example, the semiconductor die 3001 is connected to the second substrate 3020 by means of solder balls 3040. In some examples, the area of the substrate 3000 underneath the projection of the second substrate 3020 could be advantageously covered with a conductive layer to protect the semiconductor die 3001 from electromagnetic radiation.

Yet another example package is presented in FIG. 33, in which the semiconductor die 3001 is flip-chip mounted on the second substrate 3020, as in FIG. 32. However, in this example the semiconductor die 3001 is connected to the second substrate 3020 by wire bonds 3060.

The example IC packages disclosed herein are advantageously used in wireless devices. The antenna arrangement and shielding allows the IC package with antenna to be very small, and particularly useful in mobile wireless devices, for example, laptops, PDA's, cellular phones, and other devices.

The invention claimed is:

1. An integrated circuit package for an electronic device comprising:
    a substrate having a mounting area for an integrated circuit die;
    a set of electrical conductors provided on the substrate for connection between the die and external package connectors;
    a set of electrically inert fixation pads to provide mechanical connections between the package and a printed circuit board on which the package is mounted;
    an antenna comprising a feeding point, a proximal end, and a distal end, wherein the proximal end is closer than the distal end to the feeding point;
    wherein the electrical conductors are provided on the substrate outside a projection area of the antenna;
    a ground plane that is spaced away from the antenna so that no part of the ground plane falls in the projection of the antenna;
    wherein the antenna is arranged on the substrate so that the distal end is farther than the proximal end to an edge of the ground plane; and
    wherein at least one or more fixation pads are positioned in the projection area of the antenna.

2. The integrated circuit package of claim 1, further comprising:
    a second set of electrical conductors provided on the substrate, coupled to a ground potential;
    wherein at least some elements of the second set of electrical conductors are positioned on the substrate in the projection area of the antenna but only within a distance from a feedpoint of the antenna that is less than: 1) one-fifth of a side length of the integrated circuit package and 2) one-sixtieth of a free-space operating wavelength of the antenna.

3. The integrated circuit package according to claim 1, further comprising:
    a metallic shielding structure configured to be coupled to a ground potential;
    wherein the metallic shielding structure is positioned within the integrated circuit package to electrically isolate the integrated circuit die from the antenna.

4. The integrated circuit package according to claim 1, wherein the antenna is located along one edge of a first side of the integrated circuit package, and the electrical conductors of the set of electrical conductors are closer than the antenna to an opposite edge of the integrated circuit package.

5. The integrated circuit package according to claim 1, wherein the antenna is located along two edges that form a corner on a first side of the integrated circuit package, and the electrical conductors of the set of electrical conductors are closer than the antenna to an opposite corner of the integrated circuit package.

6. The integrated circuit package according to claim 1, wherein the electrical conductors of the set of electrical conductors are spaced away from the antenna by at least about 1 mm.

7. The integrated circuit package according to claim 1, wherein at least a portion of the antenna forms a space-filling curve.

8. The integrated circuit package according to claim 7, wherein the portion of the antenna forms a curve selected from the group of: a Hilbert curve, a box-counting curve, and a grid-dimension curve.

9. The integrated circuit package of claim 1, wherein the ground plane is spaced away from the antenna by at least 2.5 mm.

10. The integrated circuit package of claim 1, wherein an edge of the ground plane nearest the distal end of the antenna is chamfered so that an edge of the ground plane nearest the distal end of the antenna is farther from the antenna than the edge of the ground plane nearest the proximal end of the antenna.

11. The integrated circuit package according to claim 1, wherein the integrated circuit package is mounted on a printed circuit board ("PCB") including a PCB ground plane; and wherein the integrated circuit package is mounted at a corner of the PCB, with the distal end of the antenna near an edge of the corner.

12. The integrated circuit package of claim 11, wherein the PCB ground plane includes a first protrusion that is located in a projection area of the integrated circuit package.

13. The integrated circuit package of claim 12, wherein the PCB ground plane further comprises a second protrusion that is located adjacent to a projection area of the integrated circuit package.

14. The integrated circuit package of claim 11, wherein the PCB ground plane is partially located in a projection area of the integrated circuit package, but the PCB ground plane does not extend into the projection area of the antenna.

15. The integrated circuit package of claim 14, wherein the PCB ground plane is provided adjacent to the projection area of the antenna on at most one side and a portion of a second side.

16. The integrated circuit package of claim 13, wherein a part of the antenna is located between projection areas formed by the first and second protrusions.

17. The integrated circuit package of claim 11, wherein the PCB ground plane has a rectangular or square portion that is located in a projection of a corner of the integrated circuit package that is opposite to a corner of the integrated circuit package that is in line with said corner of the PCB.

18. The integrated circuit package of claim 17, wherein the feeding point of the antenna is near said rectangular or square portion of the PCB ground plane, and wherein a first part of the antenna leads from the feedpoint to a second part of the antenna that is shaped as a space-filling curve, the first part of the antenna serving to provide separation between the second part of the antenna and the PCB ground plane.

19. An integrated circuit package, comprising:
a substrate having an area for mounting an integrated circuit die;
an antenna provided on the substrate, having a projection area;
a set of electrical conductors for carrying data signals for the integrated circuit die;
wherein the electrical conductors are provided on the substrate in an area formed by the union of:
a) a sub-area outside the projection area of the antenna, and
b) a sub-area inside the projection area of the antenna and also inside an area that is a distance from a feedpoint of the antenna less than: 1) one-half of a side length of the integrated circuit package and 2) one-twenty-fourth of a free-space operating wavelength of the antenna.

20. The integrated circuit package according to claim 19, wherein the electrical conductors of said set of electrical conductors are selected from the group consisting of pads, pins, tracks, and ground planes.

21. The integrated circuit package according to claim 19, further comprising at least one digital track, wherein the at least one digital track includes a filtering means to minimize radio frequency noise thereon.

22. The integrated circuit package according to claim 19, further comprising digital tracks attached to the integrated circuit package that are mismatched at RF frequencies.

23. The integrated circuit package according to claim 19, further comprising tracks attached to the integrated circuit package that are differential lines.

24. The integrated circuit package according to claim 19, further comprising means for shielding at least a portion of the integrated circuit package from the antenna.

25. The integrated circuit package according to claim 19, wherein a part of the antenna has a shape of a box-counting curve.

26. The integrated circuit package according to claim 19, wherein a part of the antenna has a shape of a grid dimension curve.

27. The integrated circuit package of claim 25, wherein a value of the box-counting dimension is between about 1.17 and about 2.

28. The integrated circuit package of claim 19, wherein the integrated circuit package is mounted on a printed circuit board ("PCB") including a PCB ground plane;
wherein the integrated circuit package further comprises:
a first ground plane formed within the integrated circuit package and electrically coupled to the PCB ground plane;
a second ground plane formed within the integrated circuit package;
wherein the first and second ground planes are placed spatially within the integrated circuit package at a distance from the antenna; and
wherein one of the first and second ground planes is an RF ground plane and the other of the first and second ground planes is a digital ground plane.

29. The integrated circuit package of claim 28, wherein the digital ground plane is located closer to an end point of the antenna in comparison to the proximity of the RF ground plane to the end point of the antenna.

30. An integrated circuit package for an electronic device comprising:
a substrate having a mounting area for an integrated circuit die;
a set of electrical conductors provided on the substrate for connection between the die and external package connectors;
an antenna provided on the substrate, wherein the electrical conductors are provided on the substrate outside a projection area of the antenna; and
a ground plane provided on the substrate, wherein the ground plane is spaced away from the antenna by at least the greater of one-quarter of a side length of the integrated circuit package and one-fiftieth of a free-space operating wavelength of the antenna, so that no part of the ground plane falls in the projection of the antenna.

31. The integrated circuit package of claim 30, wherein the antenna is located along two edges that form a corner on a first side of the integrated circuit package, and the electrical conductors of the set of electrical conductors are closer than the antenna to an opposite corner of the integrated circuit package.

32. The integrated circuit package according to claim 30, wherein the ground plane is a first ground plane in an analog domain that is internal to the integrated circuit package; and wherein the integrated circuit package comprises a second ground plane in a digital domain that is internal to the integrated circuit package.

33. The integrated circuit package of claim 32, wherein the digital ground plane is located closer to an end point of the antenna in comparison to a proximity of the analog ground plane to the end point of the antenna.

34. The integrated circuit package of claim 33, wherein the first ground plane is an RF ground plane.

35. The integrated circuit package according to claim 30, further comprising an electromagnetic shield surrounding a component of the integrated circuit package at least partially.

36. The integrated circuit package of claim 35, wherein the antenna is located outside a projection of the shield.

37. The integrated circuit package of claim 35, wherein the shield comprises a grid of conductive material where the distance between the lines which form the grid is less than or equal to one-tenth of a free space operating wavelength of the antenna.

38. The integrated circuit package of claim 35, wherein the shield comprises a conductive plate with a central aperture in which the portion of the integrated circuit package is located.

39. The integrated circuit package of claim 35, wherein the shield comprises a conductive element located over the portion of the integrated circuit package.

40. The integrated circuit package of claim 35, wherein the shield comprises a second substrate located over the portion of the integrated circuit package to be isolated, and wherein the second substrate includes a conductive layer.

41. The integrated circuit package of claim 35, wherein the portion of the integrated circuit package to be isolated is housed in a cavity lined with a shielding layer and overmolded.

42. The integrated circuit package of claim 35, wherein the portion of the integrated circuit package to be isolated is shielded with metallic paint.

43. A wireless device comprising:
a radio frequency (RF) communication integrated circuit package, including:
an integrated circuit die;
a plurality of connectors external to the integrated circuit package;
a first set of electrically conductive elements coupled to the integrated circuit die providing connection between the integrated circuit die and the plurality of connectors external to the integrated circuit package;
an antenna;
the antenna and the first set of electrically conductive elements being spaced within the integrated circuit package such that no element of the first set of electrically conductive elements is in the projection of the antenna;
a metallic shielding structure external to the integrated circuit die coupled to a ground potential and positioned within the integrated circuit package to electrically isolate the integrated circuit die from the antenna; and
the antenna being arranged within the integrated circuit package such that at least a portion of the antenna is outside a projection of the metallic shielding structure.

44. The wireless device according to claim 43, wherein the wireless device is selected from the group consisting of a handset, a wireless device, a personal digital assistant, and a personal computer.

45. The wireless device according to claim 43, wherein the wireless device operates at least one of the following wireless connectivity services: Bluetooth™, Hyperlan, IEEE802.11, Ultra Wide Band, Wimax, and Zig Bee.

46. The wireless device according to claim 43, wherein the wireless device operates at least one of the following communication standards and services: GSM, UMTS, PCS 1900, KPCS, CDMA, WCDMA, DAB, and GPS.

47. An electronic device comprising:
a printed circuit board including a ground plane;
an integrated circuit package mounted on the printed circuit board, the integrated circuit package including:
a substrate having a mounting area for an integrated circuit die;
an antenna element provided on the substrate, wherein the antenna element operates in cooperation with said ground plane;
a feeding conductor provided on the substrate for connection between the integrated circuit die and the antenna element;
a plurality of electrical conductors provided on the substrate for connection between the integrated circuit die and external package connectors, wherein the electrical conductors of the plurality of electrical conductors are provided on the substrate outside a projection area of the antenna element;
wherein at least one of the external package connectors is coupled to said ground plane; and
wherein the antenna element is located along two edges that form a corner on a first side of the integrated circuit package, and the electrical conductors of the plurality of electrical conductors are closer than the antenna element to an opposite corner of the integrated circuit package.

48. The electronic device according to claim 47, wherein the antenna element comprises a first end and a second end, and wherein a distance between the first end and said opposite corner is larger than a distance between the first end and another corner of the integrated circuit package.

49. The electronic device according to claim 47, wherein the antenna element defines a substantially L-shaped footprint on the substrate.

50. The integrated circuit package of claim 30, further comprises
a set of electrically inert fixation pads to provide mechanical connections between the package and a printed circuit board on which the package is mounted;
wherein at least one or more fixation pads are positioned in the projection area of the antenna.

* * * * *